(12) United States Patent
Kim et al.

(10) Patent No.: US 12,501,621 B2
(45) Date of Patent: Dec. 16, 2025

(54) SEMICONDUCTOR DEVICE AND ELECTRONIC SYSTEM THEREWITH

(71) Applicant: SAMSUNG ELECTRONICS CO., LTD., Suwon-si (KR)

(72) Inventors: Sujeong Kim, Seoul (KR); Bongsoon Lim, Seoul (KR); Hongsoo Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 805 days.

(21) Appl. No.: 17/836,831

(22) Filed: Jun. 9, 2022

(65) Prior Publication Data
US 2023/0115503 A1    Apr. 13, 2023

(30) Foreign Application Priority Data
Oct. 8, 2021    (KR) .................. 10-2021-0134268

(51) Int. Cl.
| | |
|---|---|
| *H10B 43/50* | (2023.01) |
| *H10B 41/10* | (2023.01) |
| *H10B 41/27* | (2023.01) |
| *H10B 41/50* | (2023.01) |
| *H10B 43/10* | (2023.01) |
| *H10B 43/27* | (2023.01) |

(52) U.S. Cl.
CPC ............ *H10B 43/50* (2023.02); *H10B 41/10* (2023.02); *H10B 41/27* (2023.02); *H10B 41/50* (2023.02); *H10B 43/10* (2023.02); *H10B 43/27* (2023.02)

(58) Field of Classification Search
CPC ........ H10B 43/50; H10B 41/10; H10B 41/27; H10B 41/50; H10B 43/10; H10B 43/27; H10B 41/35; H10B 41/41; H10B 43/35; H10B 43/40
See application file for complete search history.

(56) References Cited

U.S. PATENT DOCUMENTS

| | | | |
|---|---|---|---|
| 10,373,972 B2 | 8/2019 | Park et al. | |
| 10,937,803 B2 | 3/2021 | Kashima et al. | |
| (Continued) | | | |

FOREIGN PATENT DOCUMENTS

| | | |
|---|---|---|
| CN | 107658306 A | 2/2018 |
| CN | 109817627 A | 5/2019 |
| (Continued) | | |

*Primary Examiner* — Julia Slutsker
(74) *Attorney, Agent, or Firm* — Fish & Richardson P.C.

(57) ABSTRACT

A semiconductor device may include stacks extended in a first direction on a substrate, separation structures extended in the first direction and respectively provided between the stacks, vertical channels penetrating each of the stacks, bit lines extended in a second direction crossing the first direction, each of the vertical channels being overlapped with a pair of the bit lines, and contact plugs connecting the bit lines to the vertical channels. Each of the stacks may include electrodes stacked on the substrate and at least two upper separation patterns dividing an upper one of the electrodes into several portions in the second direction. The vertical channels may be classified into a plurality of types, depending on a distance from one of the separation structures in the second direction, and each of the bit lines may be connected to all types of the vertical channels.

20 Claims, 31 Drawing Sheets

(56) References Cited

U.S. PATENT DOCUMENTS

| | | | |
|---|---|---|---|
| 2019/0109149 A1* | 4/2019 | Park | G11C 16/0466 |
| 2020/0212059 A1 | 7/2020 | Nishikawa | |
| 2020/0381449 A1 | 12/2020 | Moon et al. | |
| 2020/0395076 A1 | 12/2020 | Kim et al. | |
| 2021/0020203 A1* | 1/2021 | Choi | G11C 5/063 |
| 2021/0066313 A1* | 3/2021 | Park | H10B 20/40 |
| 2021/0159245 A1 | 5/2021 | Hong et al. | |

FOREIGN PATENT DOCUMENTS

| | | |
|---|---|---|
| KR | 20210010210 A | 1/2021 |
| KR | 20210027938 A | 3/2021 |

* cited by examiner

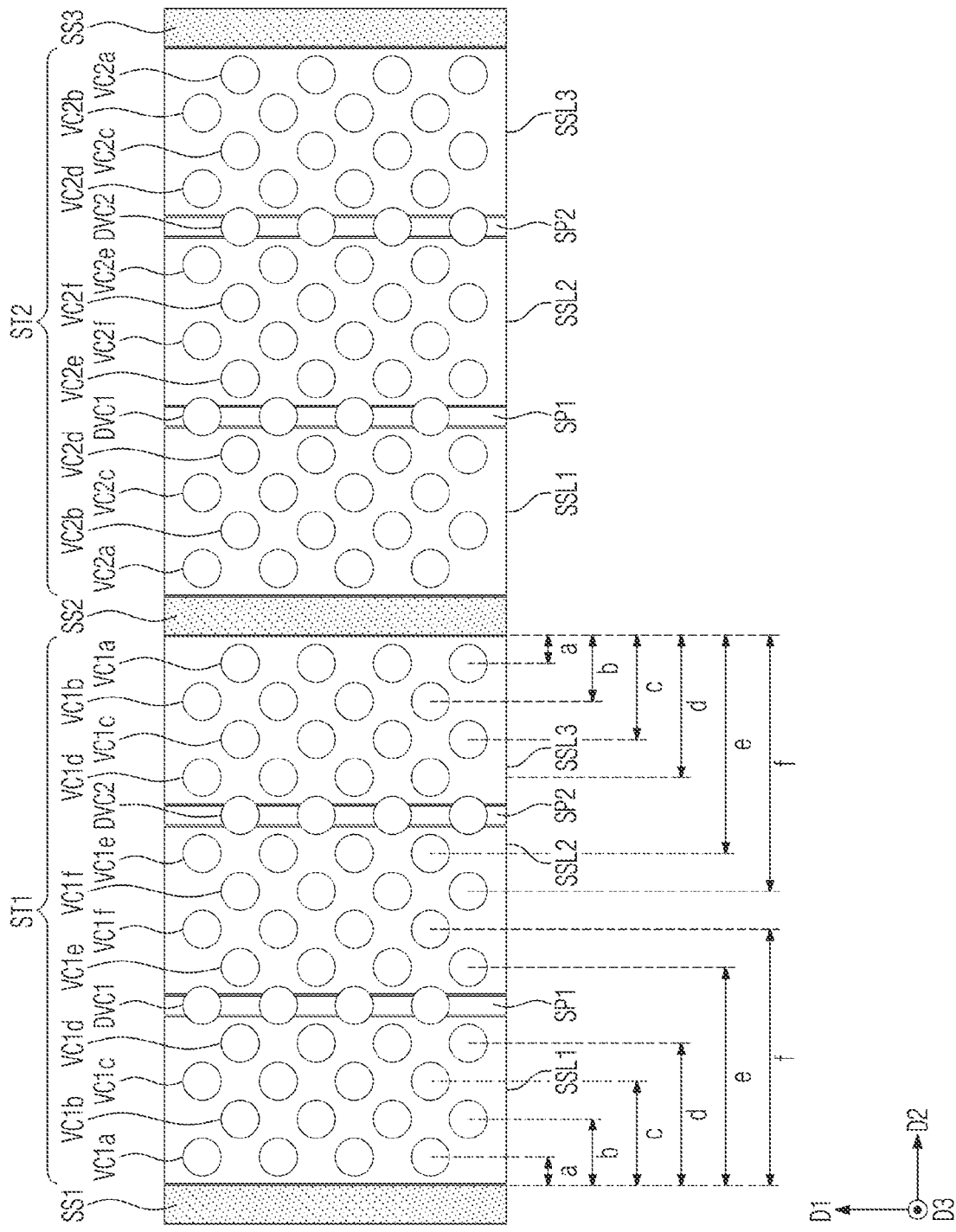

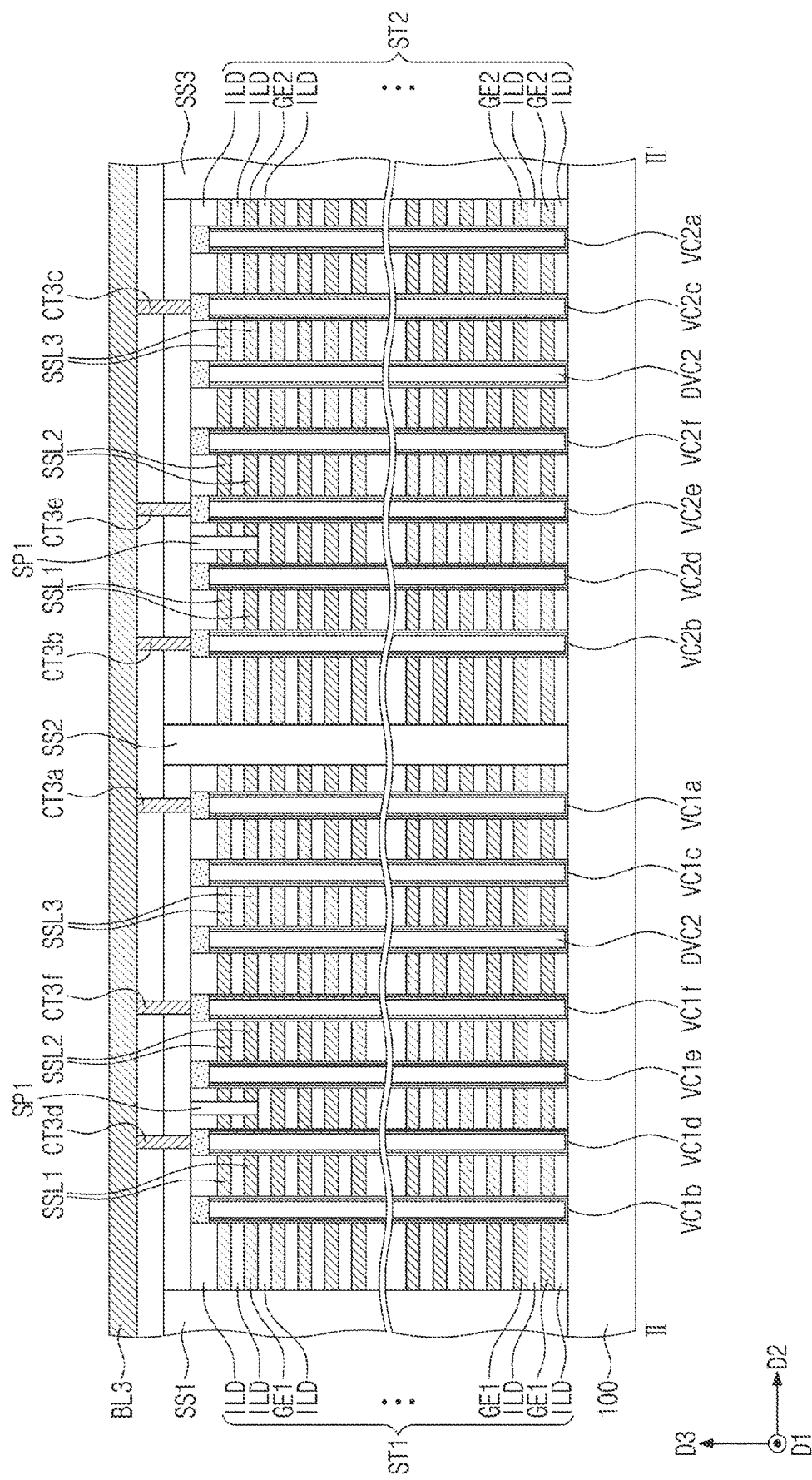

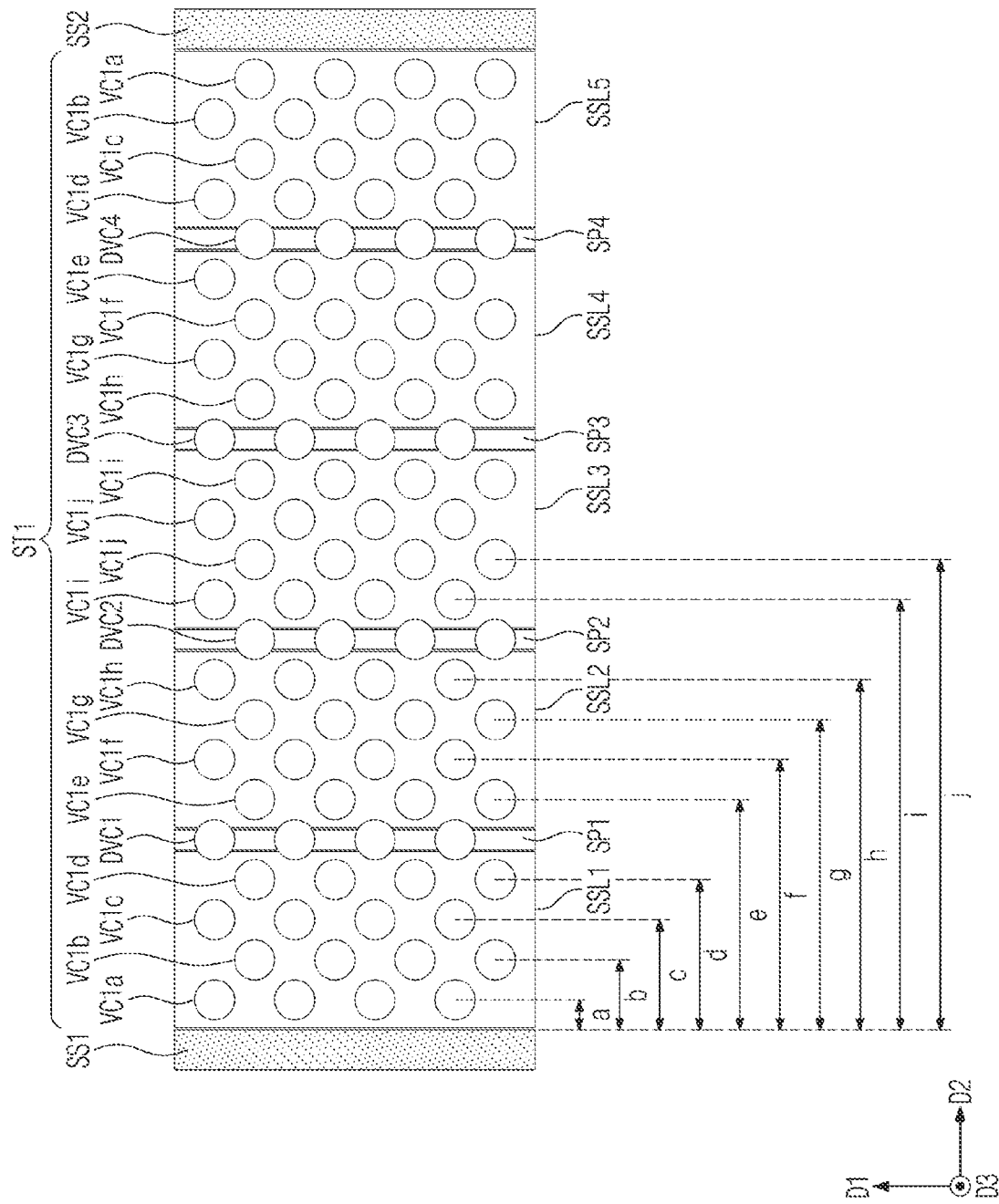

SEMICONDUCTOR DEVICE AND ELECTRONIC SYSTEM THEREWITH

CROSS-REFERENCE TO RELATED APPLICATIONS

This U.S. non-provisional patent application claims priority under 35 U.S.C. § 119 to Korean Patent Application No. 10-2021-0134268, filed on Oct. 8, 2021, in the Korean Intellectual Property Office, the entire contents of which are hereby incorporated by reference.

BACKGROUND

The present disclosure relates to a semiconductor device and an electronic system including the same.

A semiconductor device capable of storing a large capacity of data is required as part of an electronic system. Accordingly, many studies are being conducted to increase the data storage capacity of the semiconductor device. For example, semiconductor devices in which memory cells are three-dimensionally arranged are being suggested.

SUMMARY

An embodiment of the disclosure provides a semiconductor device with improved reliability and an increased integration density.

An embodiment of the disclosure provides an electronic system including the semiconductor device.

According to an embodiment of the disclosure, a semiconductor device may include stacks provided on a substrate and extending in a first direction, separation structures extending in the first direction and respectively provided between the stacks, a plurality of vertical channels penetrating each of the stacks, bit lines extending in a second direction crossing the first direction, each of the vertical channels being overlapped with a pair of the bit lines, and contact plugs connecting the bit lines to the vertical channels. Each of the stacks may include a plurality of electrodes stacked on the substrate and at least two upper separation patterns dividing an upper one of the electrodes into a plurality of portions in the second direction. The vertical channels may be classified into a plurality of types, depending on a distance from one of the separation structures in the second direction, and each of the bit lines may be connected to all types of the vertical channels.

According to an embodiment of the disclosure, a semiconductor device may include a first stack including first electrodes which are stacked on a substrate and at least two first upper separation patterns which horizontally divides a first upper electrode of the first electrodes into a plurality of portions. A second stack includes second electrodes which are stacked on the substrate and at least two second upper separation patterns which horizontally divide a second upper electrode of the second electrodes into a plurality of portions. A plurality of first vertical channels penetrate the first stack. A plurality of second vertical channels penetrate the second stack. A plurality of bit lines cross the first and second stacks, and contact plugs connect the first and second vertical channels to the bit lines. Each of the first and second vertical channels may be overlapped with a pair of the bit lines, and the first and second vertical channels may be classified into a plurality of types depending on a distance from each of the separation structures in a second direction. Each of the bit lines may be connected to some types of the first vertical channels and remaining types of the second vertical channels.

According to an embodiment of the disclosure, an electronic system may include a semiconductor device including a cell structure, a peripheral circuit connected to the cell structure, and an input/output pad electrically connected to the peripheral circuit. A controller electrically connects to the semiconductor device through the input/output pad to control the semiconductor device. The cell structure may include stacks provided on a substrate and extending in a first direction, separation structures extending in the first direction and respectively provided between the stacks, a plurality of vertical channels penetrating each of the stacks, bit lines extending in a second direction crossing the first direction, each of the vertical channels being overlapped with two bit lines of the bit lines, and contact plugs connecting the bit lines to the vertical channels. Each of the stacks may include a plurality of electrodes stacked on the substrate and at least two upper separation patterns separating an upper one of the electrodes into a plurality of portions in the second direction. The vertical channels may be classified into a plurality of types depending on a distance from one of the separation structures in the second direction, and each of the bit lines may be connected to all types of the vertical channels.

BRIEF DESCRIPTION OF THE DRAWINGS

FIG. 6 is a plan view illustrating an arrangement of vertical channels of a semiconductor device according to an embodiment of the disclosure.

FIGS. 10A and 10B are sectional views which are respectively taken along lines I-I' and II-II' of FIG. 9 to illustrate a semiconductor device according to an embodiment of the disclosure.

FIG. 21 is a plan view illustrating an arrangement of vertical channels of a semiconductor device according to an embodiment of the disclosure.

DETAILED DESCRIPTION

Example embodiments of the disclosures will now be described more fully with reference to the accompanying drawings.

Figure 1:
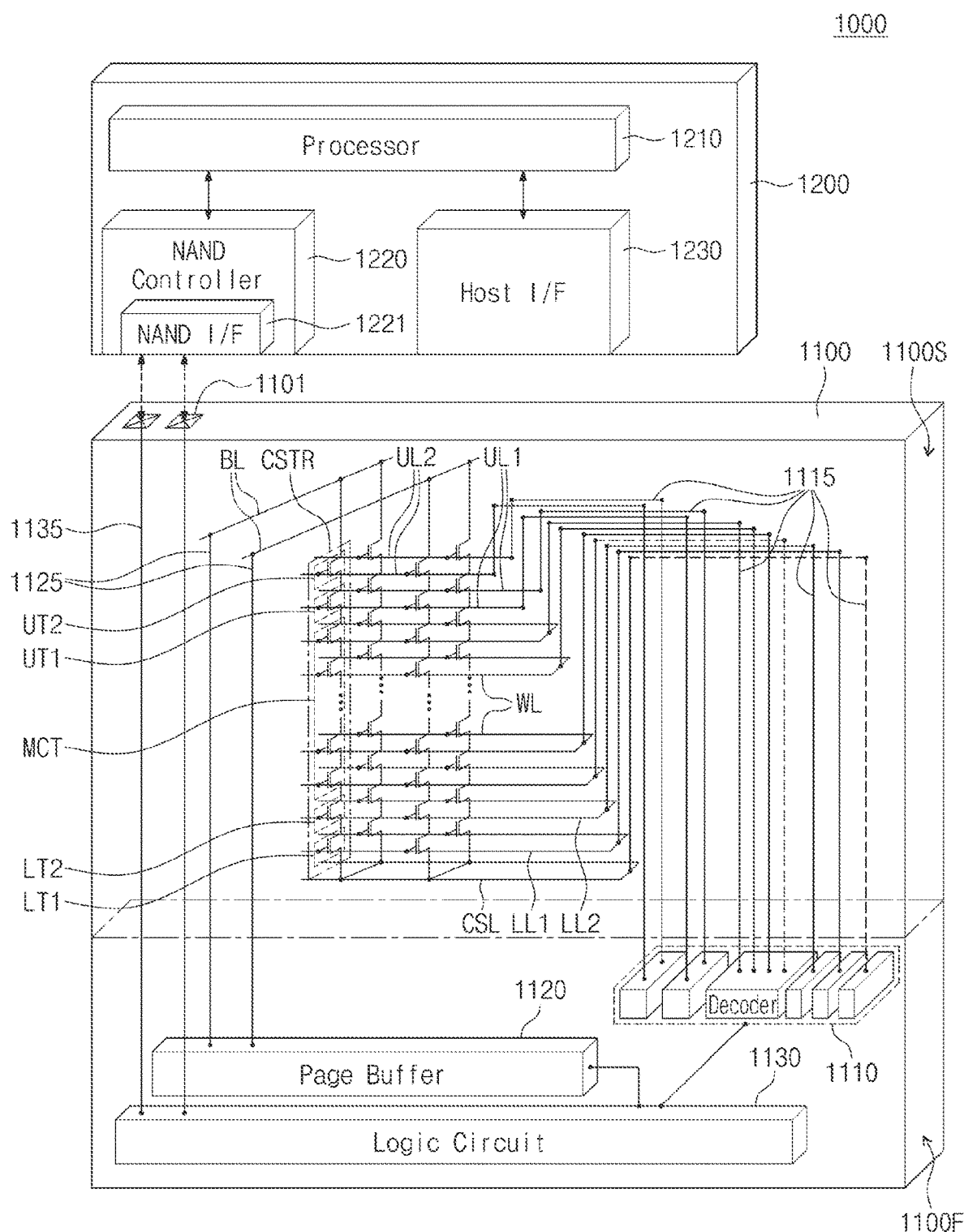
FIG. 1 is a diagram schematically illustrating an electronic system including a semiconductor device according to an embodiment of the disclosure.

FIG. 1 is a diagram schematically illustrating an electronic system including a semiconductor device according to an embodiment of the disclosure.

Referring to FIG. 1, an electronic system 1000 according to an embodiment of the disclosure may include a semiconductor device 1100 and a controller 1200, which is electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an embodiment, the first structure 1100F may be disposed near the second structure 1100S.

The first structure 1100F may be a peripheral circuit structure, which includes a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, the upper transistors UT1 and UT2 may include at least one string selection transistor, and the lower transistors LT1 and LT2 may include at least one ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used to perform an erase operation of erasing data in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F to the second structure 1100S. The bit lines BL may be electrically connected to the page buffer 1120 through second connection lines 1125, which are extended from the first structure 1100F to the second structure 1100S.

In the first structure 1100F, the decoder circuit 1110 and the page buffer 1120 may be configured to perform a control operation on at least one transistor that is selected from the memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135, which is provided in the first structure 1100F and is extended into the second structure 1100S.

Although not shown, the first structure 1100F may include a voltage generator (not shown). The voltage generator may generate a program voltage, a read voltage, a pass voltage, a verification voltage, and so forth, which are needed to operate the memory cell strings CSTR. Here, the program voltage may be a relatively high voltage (e.g., 20V to 40V), compared with the read voltage, the pass voltage, and the verification voltage.

In an embodiment, the first structure 1100F may include high voltage transistors and low voltage transistors. The decoder circuit 1110 may include pass transistors which are connected to the word lines WL of the memory cell strings CSTR. The pass transistors may include high-voltage transistors which can stand a high voltage (e.g., the program voltage) applied to the word lines WL during a programming operation. The page buffer 1120 may also include high-voltage transistors which can stand the high voltage.

The controller 1200 may include a processor 1210, a NAND controller 1220, and a host interface 1230. In an embodiment, the electronic system 1000 may include a plurality of semiconductor devices 1100, and in this case, the controller 1200 may control the semiconductor devices 1100.

The processor 1210 may control overall operations of the electronic system 1000 including the controller 1200. The processor 1210 may be operated based on specific firmware and may control the NAND controller 1220 to access the semiconductor device 1100. The NAND controller 1220 may include a NAND interface 1221, which is used to communicate with the semiconductor device 1100. The NAND interface 1221 may be used to transmit and receive control commands for controlling the semiconductor device 1100 and data to be written in or read from the memory cell transistors MCT of the semiconductor device 1100. The host interface 1230 may be configured to allow for communication between the electronic system 1000 and an external host. When a control command is received from an external host through the host interface 1230, the processor 1210 may control the semiconductor device 1100 in response to the control command.

Figure 2:
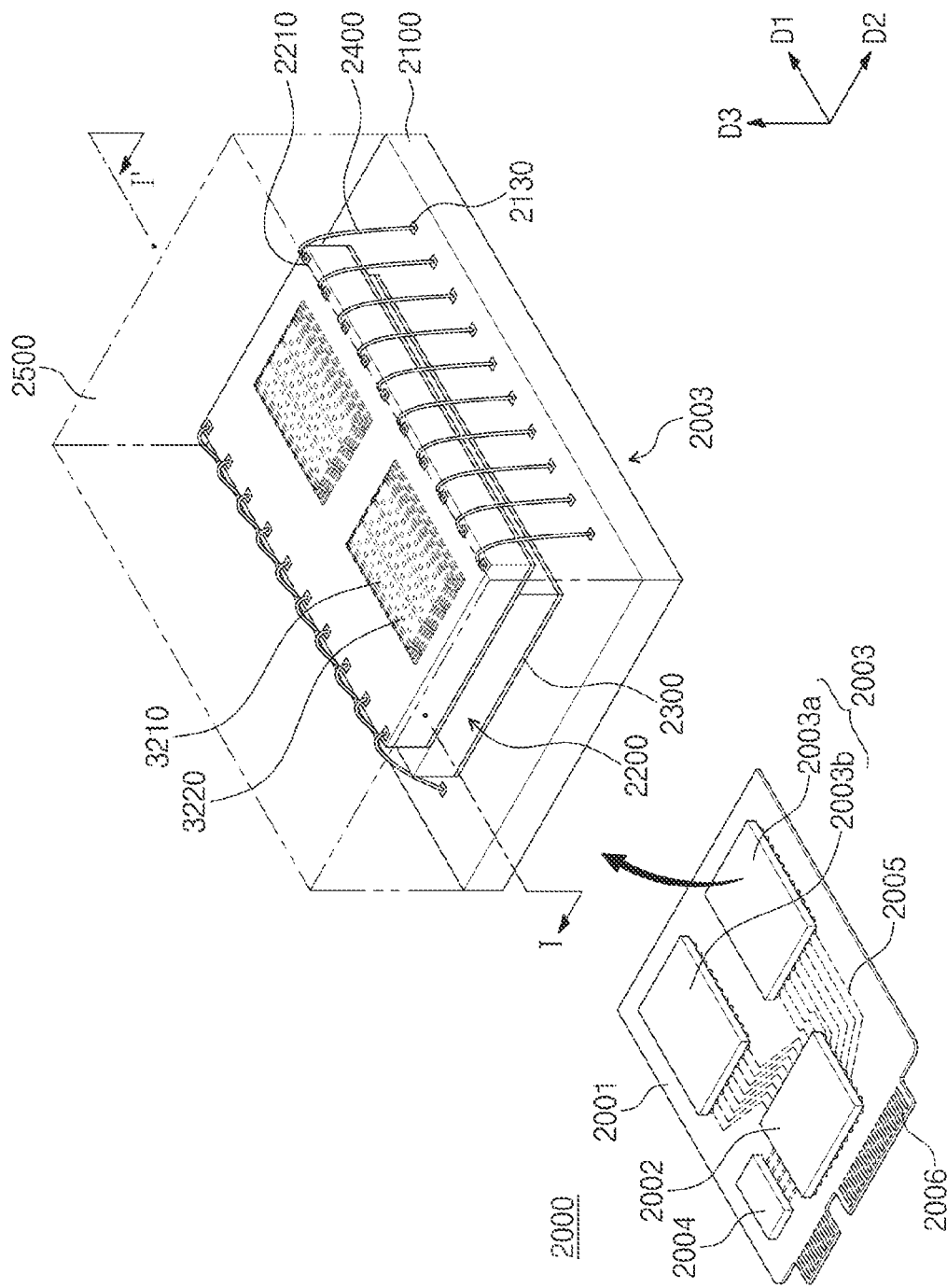
FIG. 2 is a perspective view schematically illustrating an electronic system including a semiconductor device according to an embodiment of the disclosure.

FIG. 2 is a perspective view schematically illustrating an electronic system including a semiconductor device according to an embodiment of the disclosure.

Referring to FIG. 2, an electronic system 2000 according to an embodiment of the disclosure may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 through interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host in accordance with one of interfaces, such as a universal serial bus (USB), a peripheral component interconnect express (PCI-Express), a serial advanced technology attachment (SATA), a universal flash storage (UFS) M-Phy, or the like. In an embodiment, the electronic system 2000 may be driven by power supplied from the external host through the connector 2006. The electronic system 2000 may further include a power management integrated circuit (PMIC) that is configured to separately provide electric power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In an embodiment, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stacks 3210 and vertical structures 3220. Each of the semiconductor chips 2200 may include a semiconductor device, which will be described below, according to an embodiment of the disclosure.

In an embodiment, the connection structure 2400 may include a bonding wire electrically connecting the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, which is prepared regardless of the main substrate 2001, and may be connected to each other through interconnection lines, which are provided in the interposer substrate.

Figure 3:
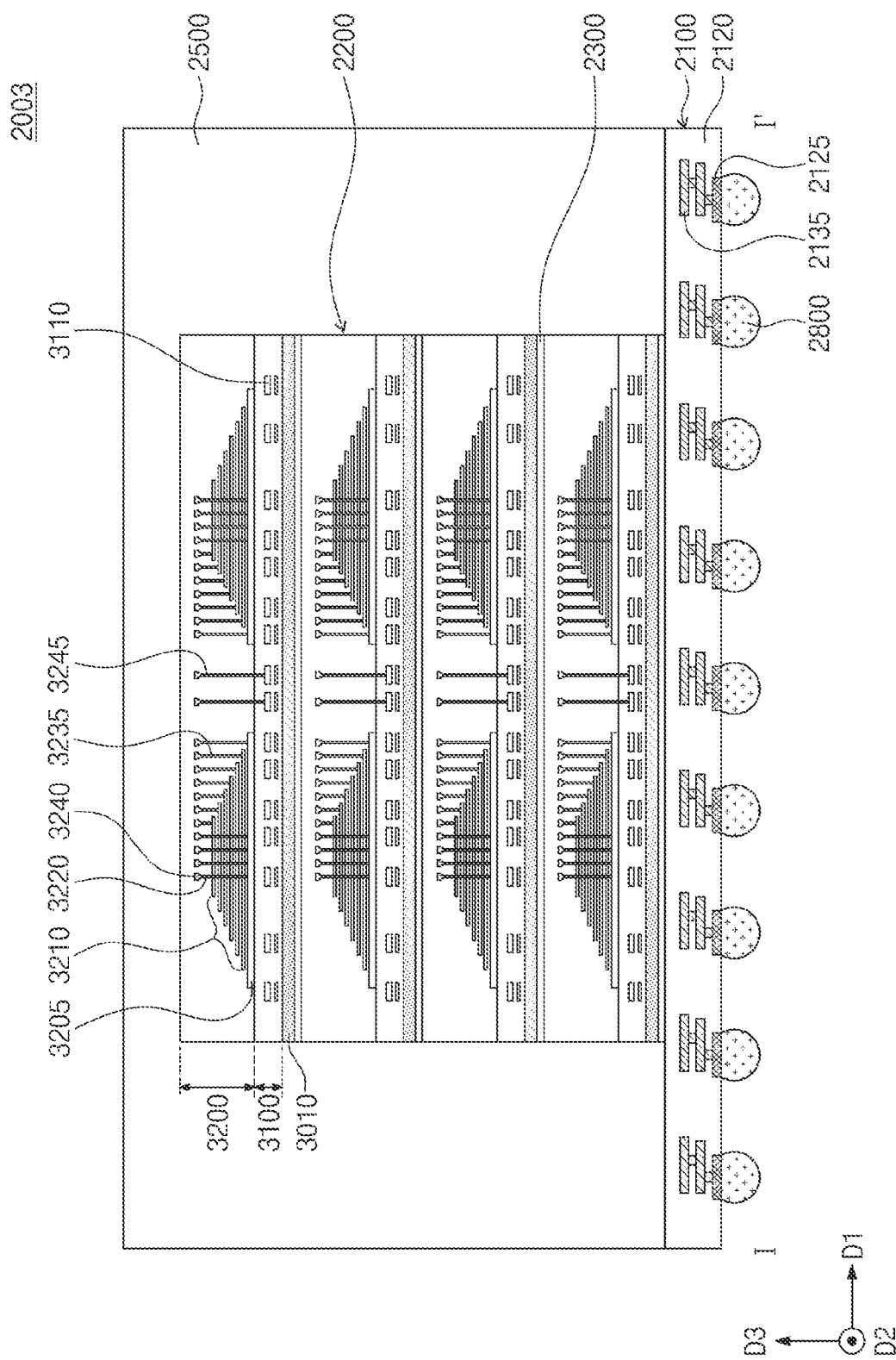
FIGS. 3 and 4 are sectional views schematically illustrating semiconductor packages according to an embodiment of the disclosure.
Figure 4:
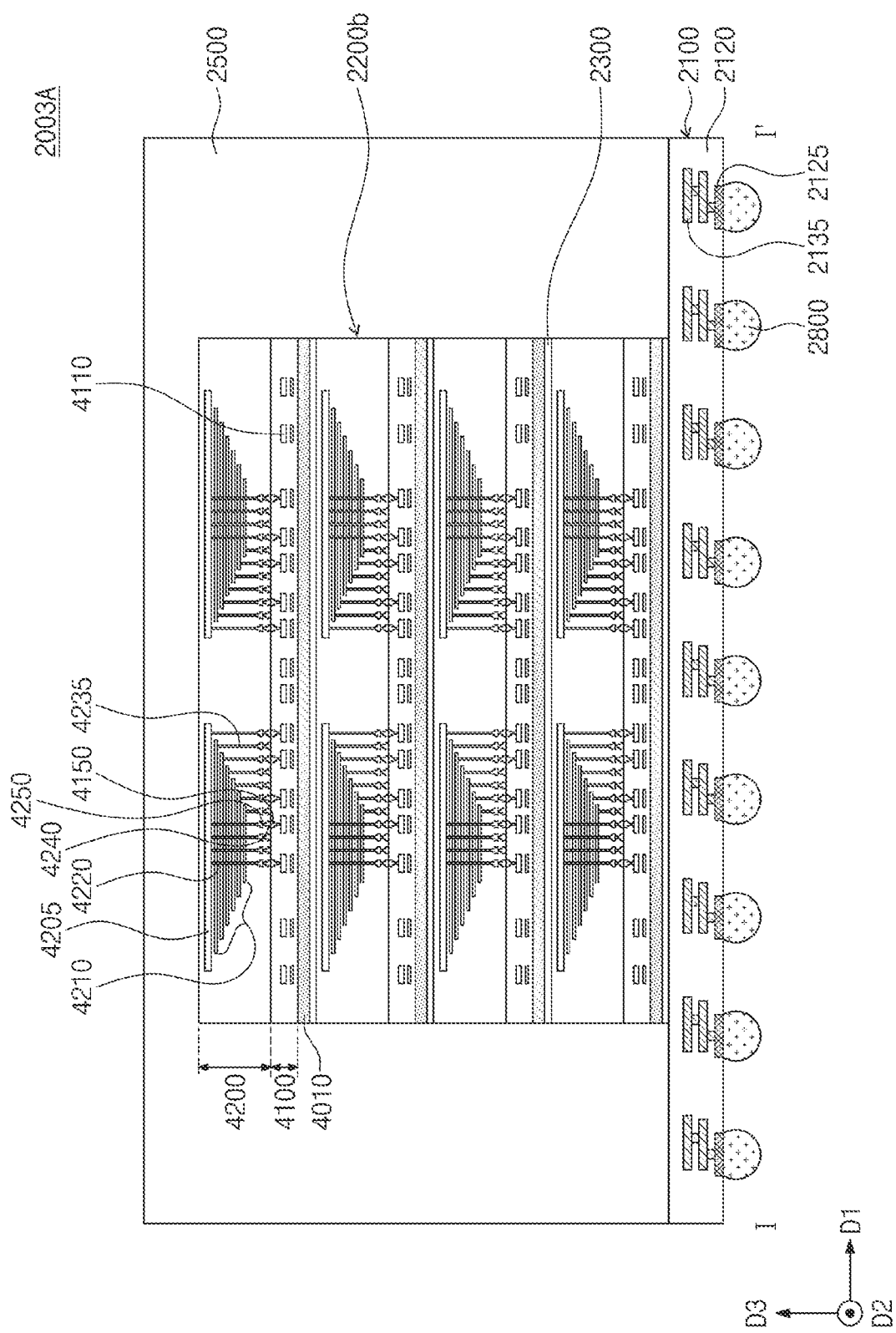

FIGS. 3 and 4 are sectional views schematically illustrating semiconductor packages according to an embodiment of the disclosure. FIGS. 3 and 4 are sectional views, which are taken along a line I-I' of FIG. 2 to illustrate two different examples of the semiconductor package of FIG. 2.

Referring to FIG. 3, in the semiconductor package 2003, the package substrate 2100 may be a printed circuit board. The package substrate 2100 may include a package substrate body portion 2120, the package upper pads 2130 (e.g., of FIG. 2), which are disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005 of the main substrate 2001 of the electronic system 2000 through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, a stack 3210 on the source structure 3205, the vertical structures 3220 and separation structures penetrating the stack 3210, bit lines 3240 electrically connected to the vertical structures 3220, and cell contact plugs 3235 electrically connected to the word lines WL (e.g., of FIG. 1) of the stack 3210. Each of the first and second structures 3100 and 3200 and the semiconductor chips 2200 may further include separation structures to be described below.

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210, and in an embodiment, the penetration line 3245 may be provided to further penetrate the stack 3210. Each of the semiconductor chips 2200 may further include the input/output pads 2210 (e.g., of FIG. 2), which are electrically connected to the peripheral lines 3110 of the first structure 3100.

Referring to FIG. 4, in a semiconductor package 2003A, each of the semiconductor chips 2200b may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the first structure 4100 and the source structure 4205, vertical structures 4220 and a separation structure penetrating the stack 4210, and second junction structures 4250, which are electrically and respectively connected to the vertical structures 4220 and the word lines WL (e.g., see FIG. 1) of the stack 4210. For example, the second junction structures 4250 may be electrically and respectively connected to the vertical structures 4220 and the word lines WL (e.g., of FIG. 1) through bit lines 4240, which are electrically connected to the vertical structures 4220, and cell contact plugs 4235, which are electrically connected to the word lines WL (e.g., of FIG. 1). The first junction structures 4150 of the first structure 4100 may be in contact with and bonded to the second junction structures 4250 of the second structure 4200. The bonded portions of the first and second junction structures 4150 and 4250 may be formed of or include, for example, copper (Cu).

Each of the first and second structures 4100 and 4200 and the semiconductor chips 2200b may further include a source structure in an embodiment to be described below. Each of the semiconductor chips 2200b may further include the input/output pads 2210 (e.g., of FIG. 2), which are electrically connected to the peripheral lines 4110 of the first structure 4100.

The semiconductor chips 2200 or 2200b of FIG. 3 or 4 may be electrically connected to each other by the connection structures 2400, which are provided in the form of bonding wires. However, in an embodiment, semiconductor chips, which are provided in the same semiconductor package as the semiconductor chips 2200 or 2200b of FIG. 3 or 4, may be electrically connected to each other by a connection structure including through silicon vias (TSVs).

The first structure 3100 or 4100 of FIG. 3 or 4 may correspond to a peripheral circuit structure in an embodiment to be described below, and the second structure 3200 or 4200 of FIG. 3 or 4 may correspond to a cell array structure in an embodiment to be described below.

Figure 5:
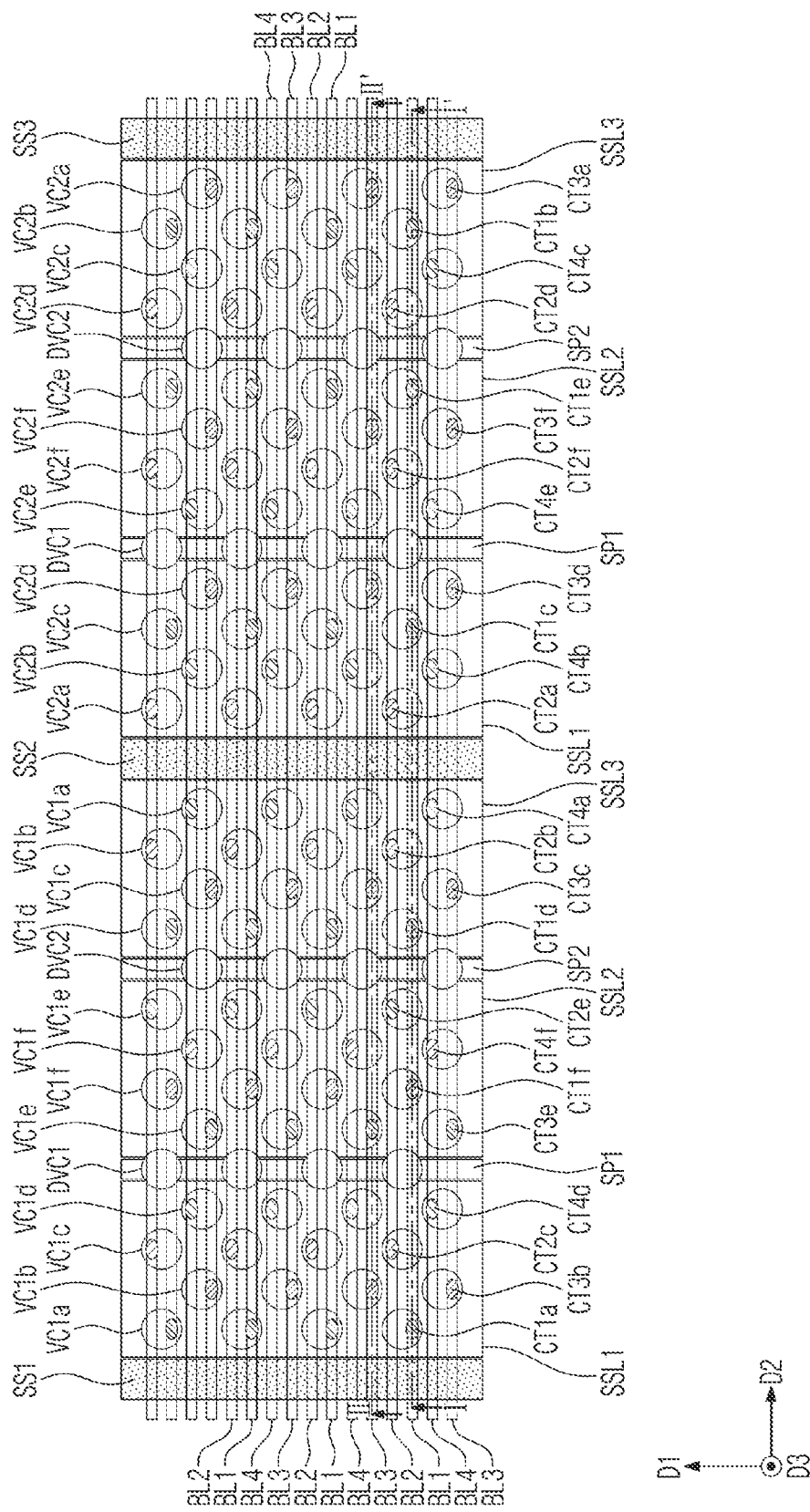
FIG. 5 is a plan view illustrating a portion of a semiconductor device according to an embodiment of the disclosure.
Figure 7A:
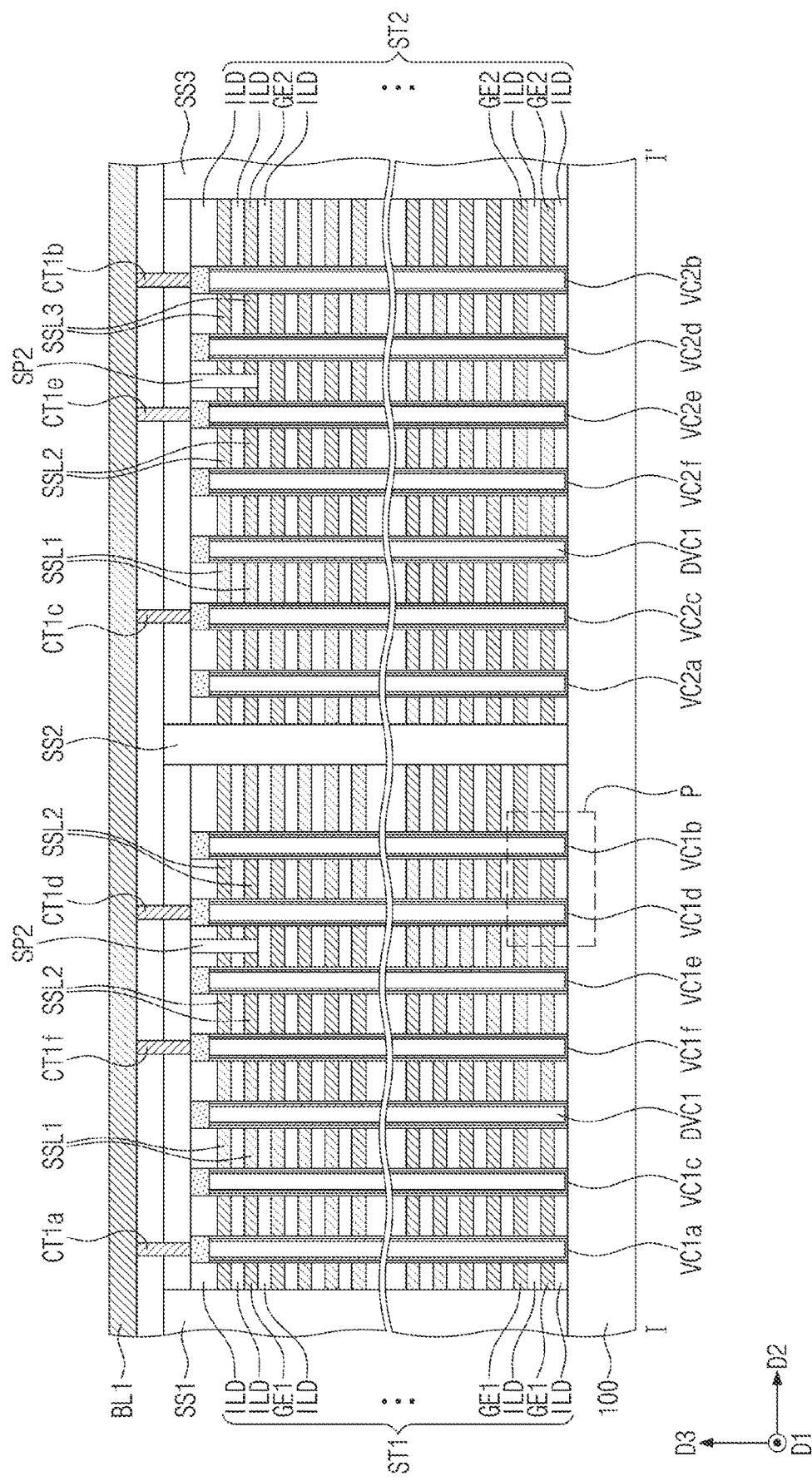
FIGS. 7A and 7B are sectional views which are respectively taken along lines I-I' and II-II' of FIG. 5 to illustrate a semiconductor device according to an embodiment of the disclosure.
Figure 7B:
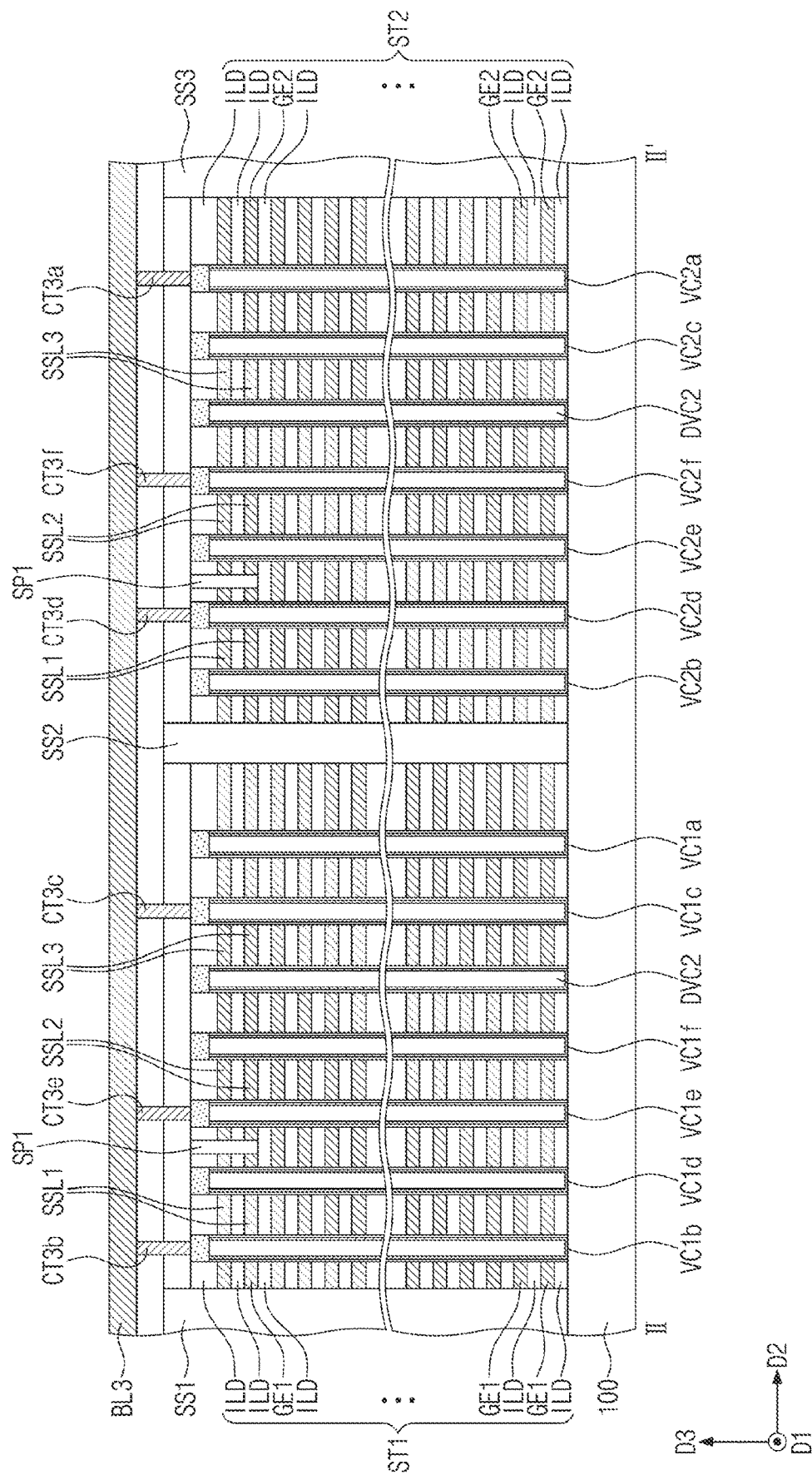
Figure 8A:
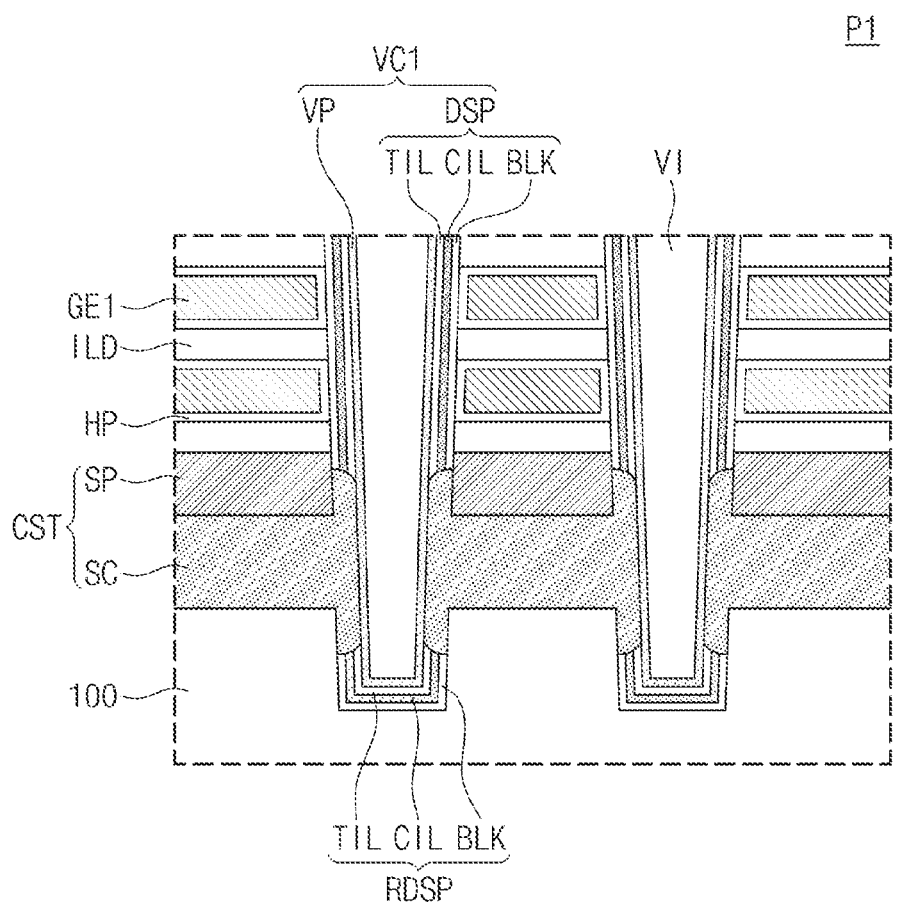
FIGS. 8A to 8C are enlarged sectional views illustrating a portion P1 of FIG. 7A.
Figure 8B:
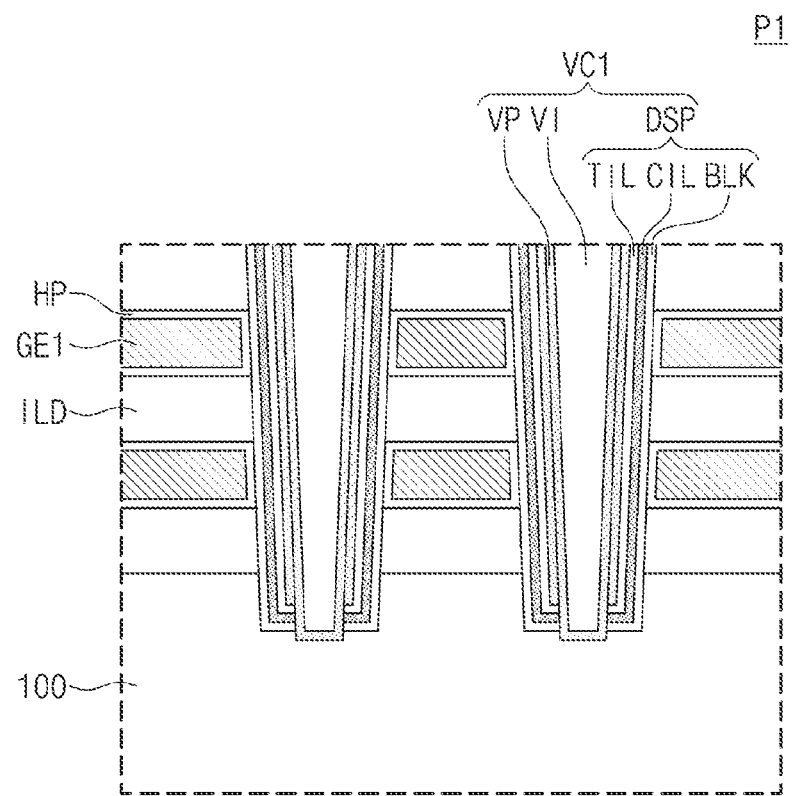
Figure 8C:
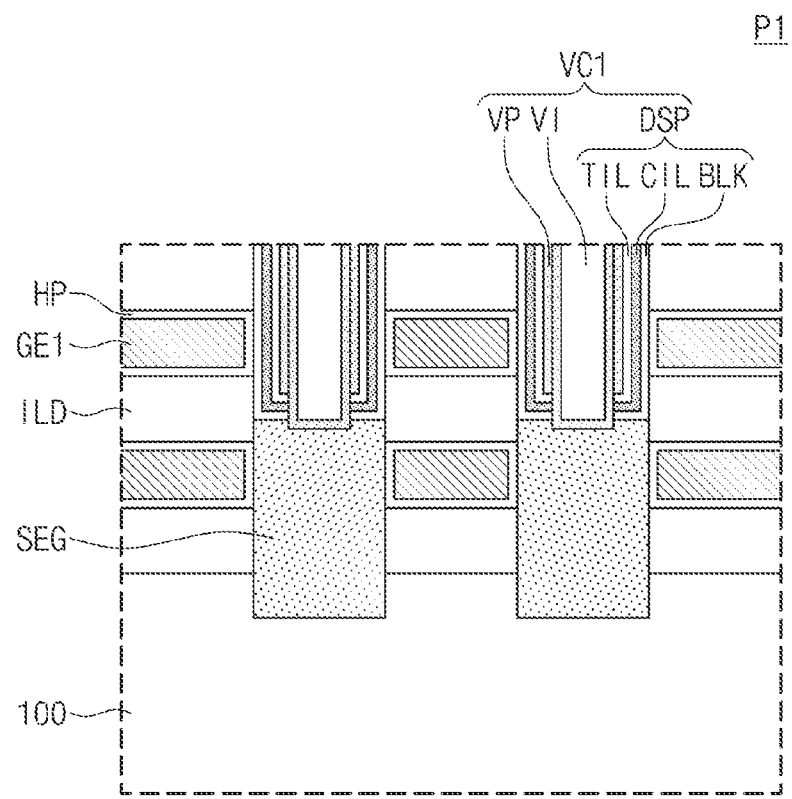

FIG. 5 is a plan view illustrating a portion of a semiconductor device according to an embodiment of the disclosure. FIG. 6 is a plan view illustrating an arrangement of vertical channels of a semiconductor device according to an embodiment of the disclosure. FIGS. 7A and 7B are sectional views which are respectively taken along lines I-I' and II-II' of FIG. 5 to illustrate a semiconductor device according to an embodiment of the disclosure. FIGS. 8A to 8C are enlarged sectional views illustrating a portion P1 of FIG. 7A.

Referring to FIGS. 5, 6, 7A, and 7B, a plurality of cell structures may be disposed on a substrate 100. As an example, first and second cell structures may be disposed on the substrate 100. The first cell structure may include a first stack ST1 and first vertical channels VC1a-VC1f on the substrate 100. The second cell structure may include a second stack ST2 and second vertical channels VC2a-VC2f on the substrate 100.

In more detail, the first and second stacks ST1 and ST2, which are extended in a first direction D1, may be disposed on the substrate 100. Here, the first direction D1 may be substantially parallel to a top surface of the substrate 100.

The substrate 100 may include at least one of a semiconductor material (e.g., silicon), an insulating material (e.g., glass), or a semiconductor or conductive material covered with an insulating material. For example, the substrate 100 may be a silicon wafer of a first conductivity type.

The first and second stacks ST1 and ST2 may be extended in the first direction D1 to be parallel to each other and may be spaced apart from each other in a second direction D2 that is perpendicular to the first direction D1. Here, the first and second directions D1 and D2 may be parallel to the top surface of the substrate 100.

The first stack ST1 may include insulating layers ILD and first electrodes GE1, which are vertically and alternately stacked on the substrate 100. The second stack ST2 may include the insulating layers ILD and second electrodes GE2, which are vertically and alternately stacked on the substrate 100.

The first and second electrodes GE1 and GE2 may be formed of or include at least one of doped semiconductor materials (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The insulating layers ILD may include a silicon oxide layer and/or a low-k dielectric layer.

In an embodiment, each of the stacks ST1 and ST2 may include at least two upper separation patterns SP1 and SP2, each of which divides an upper electrode provided at its upper level into two portions in the second direction D2. In detail, each of the first and second stacks ST1 and ST2 may include first, second, and third upper electrodes SSL1, SSL2, and SSL3 and first and second upper separation patterns SP1 and SP2 horizontally separating the first, second, and third upper electrodes SSL1, SSL2, and SSL3 from each other.

The first, second, and third upper electrodes SSL1, SSL2, and SSL3 may be extended in the first direction D1 and may be spaced apart from each other in the second direction D2. Here, the first and second directions D1 and D2 may be substantially parallel to the top surface of the substrate 100. The first, second, and third upper electrodes SSL1, SSL2, and SSL3 may be used as the string selection lines described with reference to FIG. 1.

In the first stack ST1, the first and second upper separation patterns SP1 and SP2 may be provided to penetrate at least two first electrodes GE1 which are placed at the uppermost and next uppermost levels of the first electrodes GE1. In the second stack ST2, the first and second upper separation patterns SP1 and SP2 may be provided to penetrate at least two second electrodes GE2 which are placed at the uppermost and next uppermost levels of the second electrodes GE2. In an embodiment, the first and second upper separation patterns SP1 and SP2 may be formed of or include silicon oxide.

Each of separation structures SS1, SS2, and SS3 may be provided between the stacks ST1 and ST2. The separation structures SS1, SS2, and SS3 may be extended parallel to the stacks ST1 and ST2 or in the first direction D1 and may have a uniform width in the second direction D2. The separation structures SS1, SS2, and SS3 may be provided to cover opposite side surfaces of each of the stacks ST1 and ST2.

In an embodiment, the first stack ST1 may be disposed between the first and second separation structures SS1 and SS2, and the second stack ST2 may be disposed between the second and third separation structures SS2 and SS3.

The separation structures SS1, SS2, and SS3 may have top surfaces that are located at a level higher than top surfaces of the first and second vertical channels VC1a-VC1f and VC2a-VC2f. Each of the separation structures SS1, SS2, and SS3 may include an insulating layer covering the side surfaces of the first and second stacks ST1 and ST2.

The separation structures SS1, SS2, and SS3 may have a multi- or single-layered structure. The separation structures SS1, SS2, and SS3 may be formed of or include at least one of silicon oxide, silicon nitride, or poly silicon.

In an embodiment, a plurality of vertical channels VC1a-VC1f, VC2a-VC2f, DVC1, and DVC2 may be extended in a third direction D3, which is perpendicular to the top surface of the substrate 100, to penetrate each of the first and second stacks ST1 and ST2.

In each of the first and second stacks ST1 and ST2, the vertical channels VC1a-VC1f, VC2a-VC2f, DVC1, and DVC2 may be arranged to form fourteen columns, each of which is parallel to the first direction D1. The vertical channels VC1a-VC1f, VC2a-VC2f, DVC1, and DVC2 may be arranged to form a zigzag shape in the second direction D2.

In an embodiment, the vertical channels VC1a-VC1f and VC2a-VC2f may be classified into six types, depending on a distance from each of the separation structures SS1, SS2, and SS3 in the second direction D2. For example, first to sixth types of the first vertical channels VC1a-VC1f may penetrate the first stack ST1. Similarly, first to sixth types of the second vertical channels VC2a-VC2f may penetrate the second stack ST2.

In detail, referring to FIG. 6, the first to sixth types of the first vertical channels VC1a-VC1f may be sequentially arranged from the first separation structure SS1 in order enumerated, and the first to sixth types of the first vertical channels VC1a-VC1f may be sequentially arranged from the second separation structure SS2 in order enumerated. In other words, two vertical channel groups, each of which is composed of the first to sixth types of the first vertical channels VC1a-VC1f, may be provided in the first stack ST1.

The first type of the first vertical channels VC1a may be spaced apart from the first and second separation structures SS1 and SS2 by a first distance a. The second type of the first vertical channels VC1b may be spaced apart from the first and second separation structures SS1 and SS2 by a second distance b larger than the first distance a. The third type of the first vertical channels VC1c may be spaced apart from the first and second separation structures SS1 and SS2 by a third distance c larger than the second distance b. The fourth type of the first vertical channels VC1d may be spaced apart from the first and second separation structures SS1 and SS2 by a fourth distance d larger than the third distance c. The fifth type of the first vertical channels VC1e may be spaced apart from the first and second separation structures SS1 and SS2 by a fifth distance e larger than the fourth distance d. The sixth type of the first vertical channels VC1f may be spaced apart from the first and second separation structures SS1 and SS2 by a sixth distance f larger than the fifth distance e.

The first to fourth distances a, b, c, and d may be increased by substantially the same length. A difference between the fourth and fifth distances d and e may be larger than a difference between the first and second distances a and b.

Since the first to sixth types of the first vertical channels VC1a-VC1f are spaced apart from each separation structure SS1, SS2, or SS3 by different distances, coupling capacitance values of them may be different from each other.

In addition, the first dummy vertical channels DVC1 may be disposed between the fourth and fifth types of the first vertical channels VC1d and VC1e and may penetrate the first upper separation pattern SP1 and the first electrodes GE1, between the first and second upper electrodes SSL1 and SSL2.

The second dummy vertical channels DVC2 may be disposed between the fourth and fifth types of the first vertical channels VC1d and VC1e and may penetrate the second upper separation pattern SP2 and the first electrodes GE1, between the second and third upper electrodes SSL2 and SSL3.

Each of the first and second dummy vertical channels DVC1 and DVC2 may be spaced apart from the fourth and fifth types of the first vertical channels VC1d and VC1e adjacent thereto in an oblique direction. The first and second dummy vertical channels DVC1 and DVC2 may be substantially the same as the first vertical channels VC1a-VC1f in terms of structure and material.

Similarly, the first to sixth types of the second vertical channels VC2a-VC2f may be sequentially arranged from the second separation structure SS2 in order enumerated, and the first to sixth types of the second vertical channels VC2a-VC2f may be sequentially arranged from the third separation structure SS3 in order enumerated. The arrangement of the second vertical channels VC2a-VC2f penetrating the second stack ST2 may be substantially the same as that of the first vertical channels VC1a-VC1f.

In an embodiment, the first type of the first vertical channels VC1a, which are most adjacent to the second separation structure SS2, may be spaced apart from the first type of the second vertical channels VC2a, which are most adjacent to the second separation structure SS2, in a diagonal direction.

Bit lines BL1-BL4 may be provided to cross the first and second stacks ST1 and ST2 or to extend in the second direction D2. The bit lines BL1-BL4 may be disposed in pairs on a single row of the vertical channels VC1a-VC1f and VC2a-VC2f arranged in the second direction D2. For example, a pair of bit lines BL1/BL2 or BL3/BL4 may be disposed on each of the vertical channels VC1a-VC1f and VC2a-VC2f. A width of each of the bit lines BL1-BL4 may be smaller than half of a diameter of each of the vertical channels VC1a-VC1f and VC2a-VC2f.

The bit lines BL1-BL4 may include first to fourth bit lines BL1-BL4, which are sequentially arranged in the first direction D1, and the first to fourth bit lines BL1-BL4 may be repeatedly disposed in the first direction D1.

The first and second bit lines BL1 and BL2 may be disposed on a first row of the first and second vertical channels VC1a-VC1f and VC2a-VC2f arranged in the second direction D2, and the third and fourth bit lines BL3 and BL4 may be disposed on a second row of the first and second vertical channels VC1a-VC1f and VC2a-VC2f arranged in the second direction D2.

In an embodiment, each of the first to fourth bit lines BL1-BL4 may be connected to all types of vertical channels VC1a-VC1f and VC2a-VC2f through the contact plugs CT1a-CT1f, CT2a-CT2f, CT3a-CT3f, and CT4a-CT4f. The first to fourth bit lines BL1-BL4 may be provided to cross over the first and second dummy vertical channels DVC1 and DVC2 but may be electrically separated from the first and second dummy vertical channels DVC1 and DVC2.

As an example, the first bit line BL1 may be connected to the first, sixth, and fourth types of the first vertical channels VC1a, VC1f, and VC1d and the third, fifth, and second types of the second vertical channels VC2c, VC2e, and VC2b in order through the first contact plugs CT1a, CT1f, CT1d, CT1c, CT1e, and CT1b.

The second bit line BL2 may be connected to the third, fifth, and second types of the first vertical channels VC1c, VC1e, and VC1b and the first, sixth, and fourth types of the second vertical channels VC2a, VC2f, and VC2d in order through the second contact plugs CT2c, CT2e, CT2b, CT2a, CT2f, and CT2d.

The third bit line BL3 may be connected to the second, fifth, and third types of the first vertical channels VC1b, VC1e, and VC1c and the fourth, sixth, and first types of the second vertical channels VC2d, VC2f, and VC2a in order through the third contact plugs CT3b, CT3e, CT3c, CT3d, CT3f, and CT3a.

The fourth bit line BL4 may be connected to the fourth, sixth, and first types of the first vertical channels VC1d, VC1f, and VC1a and the second, fifth, and third types of the second vertical channels VC2b, VC2e, and VC2c in order through the fourth contact plugs CT4d, CT4f, CT4a, CT4b, CT4e, and CT4.

Since all types of the vertical channels VC1a-VC1f and VC2a-VC2f are electrically connected to each of the bit lines BL1-BL4, all of the bit lines BL1-BL4 may have substantially the same value in terms of coupling capacitance.

In an embodiment, each of the vertical channels VC1a-VC1f and VC2a-VC2f may include a channel pattern VP, a data storage pattern DSP, and a gapfill insulating pattern VI.

The channel pattern VP may be formed of or include at least one of semiconductor materials (e.g., silicon (Si) or germanium (Ge)). The channel pattern VP including the semiconductor material may be used as channel patterns of the memory cell transistors MCT the upper transistors UT1 and UT2, and the lower transistors LT1 and LT2 described with reference to FIG. 1.

The channel pattern VP may be shaped like a pipe or macaroni with a closed bottom. An internal space of the channel pattern VP may be filled with the gapfill insulating pattern VI. A conductive pad may be formed on the channel pattern VP, and in an embodiment, the conductive pad may be an impurity-doped region or may be formed of a conductive material.

The data storage pattern DSP may be extended in the third direction D3 to enclose a sidewall of each channel pattern VP. The data storage pattern DSP may be shaped like a pipe or macaroni with an opened top and bottom. A bottom surface of the data storage pattern DSP may be located at a level between top and bottom surfaces of a support semiconductor pattern SP. In addition, a remnant data storage pattern RDSP may be disposed in the substrate 100 to be vertically spaced apart from the data storage pattern DSP.

The data storage pattern DSP may be used as a data storing layer of a NAND FLASH memory device and may include a tunnel insulating layer TIL, a charge storing layer CIL, and a blocking insulating layer BLK, which are sequentially stacked on a side surface of the channel pattern VP. For example, the charge storing layer CIL may be a trap insulating layer, a floating gate electrode, or an insulating layer with conductive nanodots. At least one of the tunnel insulating layer TIL and the blocking insulating layer BLK may be formed of or include one of materials whose band gaps are larger than that of the charge storing layer CIL. The remnant data storage pattern RDSP may have substantially the same layer structure as the data storage pattern DSP.

In addition, referring to FIG. 8A, a horizontal insulating pattern HP may be provided to conformally cover side, top, and bottom surfaces of the electrode GE1 adjacent to the vertical channel VC1 and to cover a portion of a side surface of the vertical channel VC1. The horizontal insulating pattern HP may be formed of or include at least one of high-k dielectric materials (e.g., aluminum oxide and hafnium oxide).

Furthermore, referring to FIG. 8A, a source structure CST may be further provided between the substrate 100 and the first or second stack ST1 or ST2. The source structure CST may include a source semiconductor pattern SC and a support semiconductor pattern SP on the source semiconductor pattern SC. The source structure CST may be parallel to the top surface of the substrate 100 and may be extended parallel to the first or second stack ST1 or ST2 or in the first direction D1.

The source semiconductor pattern SC may be disposed between the substrate 100 and the first or second stack ST1 or ST2. The source semiconductor pattern SC may be formed of or include a doped semiconductor material, which contains phosphorus (P) or arsenic (As) or has a first conductivity type. As an example, the source semiconductor pattern SC may include a poly-silicon layer that is doped with n-type dopants. In each of the vertical channels VC1a-VC1f and VC2a-VC2f, a portion of a side surface of the channel pattern VP may be in contact with the source semiconductor pattern SC.

The support semiconductor pattern SP may cover a top surface of the source semiconductor pattern SC, may penetrate a portion of the source semiconductor pattern SC, and may be in contact with the substrate 100. The support semiconductor pattern SP may be formed of or include a semiconductor material, which is doped to have the first conductivity type (e.g., n-type), and/or an undoped or intrinsic semiconductor material. A concentration of the n-type dopants in the support semiconductor pattern SP may be lower than that in the source semiconductor pattern SC.

According to the embodiment shown in FIG. 8B, each of the vertical channels VC1a-VC1f and VC2a-VC2f may penetrate the stack ST and may be connected to the substrate 100. In detail, each of the vertical channels VC1a-VC1f and VC2a-VC2f may include the data storage pattern DSP and the lower channel pattern VP. The lower channel pattern VP may be in direct contact with the substrate 100 and may be shaped like a pipe with closed bottom or like the letter 'U'.

The data storage pattern DSP may be extended in the third direction D3 and may be shaped like a pipe or macaroni with an opened top and bottom. As previously described with reference to FIG. 8A, the data storage pattern DSP may be used as a data storing layer of a NAND FLASH memory device and may include the tunnel insulating layer TIL, the charge storing layer CM, and the blocking insulating layer BLK.

According to the embodiment shown in FIG. 8C, a semiconductor pillar SEG may be provided between each of the vertical channels VC1a-VC1f and VC2a-VC2f and the substrate 100.

The semiconductor pillar SEG may be provided to penetrate the first and second electrodes GE1 or GE2, which are placed at the lowermost level of the first and second stacks ST1 and ST2. The semiconductor pillar SEG may be in direct contact with the substrate 100 and may include an epitaxial layer, which is grown from the substrate 100 made of a semiconductor material. The semiconductor pillar SEG may be used to electrically connect the channel pattern VP of one of the vertical channels VC1a-VC1f and VC2a-VC2f to the substrate 100. The semiconductor pillar SEG may be formed of silicon (Si), but in an embodiment, the semiconductor pillar SEG may include at least one of germanium (Ge), silicon-germanium (Site), III-V semiconductor compounds, and/or II-VI semiconductor compounds.

Hereinafter, an embodiment of the disclosures will be described in more detail below, and a detailed description of technical features previously described with reference to FIGS. 5, 6, 7A, and 7B will be omitted for concise description.

Figure 9:
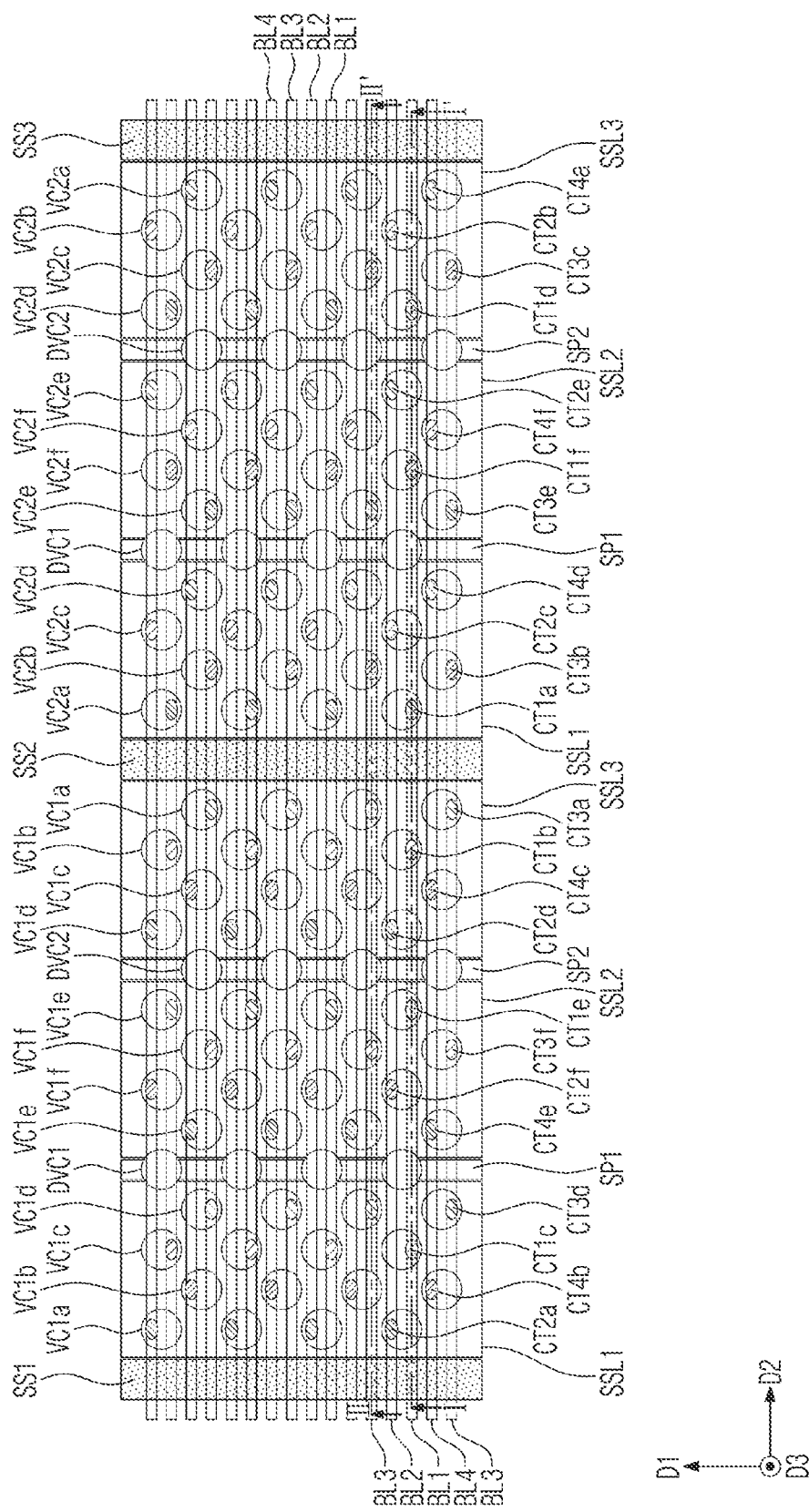
FIG. 9 is a plan view illustrating a portion of a semiconductor device according to an embodiment of the disclosure.
Figure 10A:
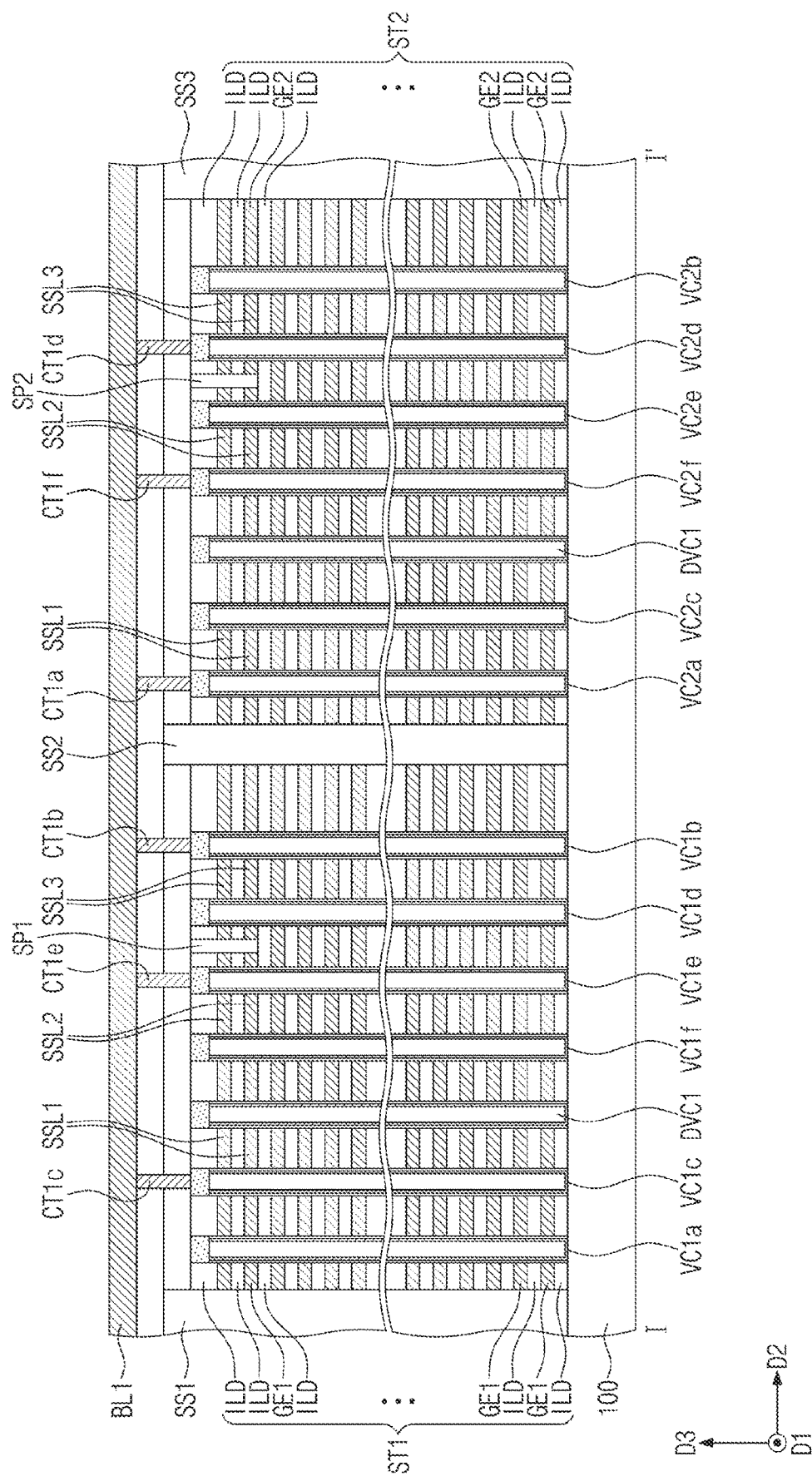

FIG. 9 is a plan view illustrating a portion of a semiconductor device according to an embodiment of the disclosure. FIGS. 10A and 10B are sectional views which are respectively taken along lines I-I' and II-II' of FIG. 9 to illustrate a semiconductor device according to an embodiment of the disclosure.

Referring to FIGS. 9, 10A, and 10B, the positions of the first to fourth contact plugs CT1a-CT1f, CT2a-CT2f, CT3a-CT3f, and CT4a-CT4f may be changed from those in the embodiment shown in FIG. 5.

In detail, the first bit line BL1 may be connected to the third, fifth, and second types of the first vertical channels VC1c, VC1e, and VC1b and the first, sixth, and fourth types of the second vertical channels VC2a, VC2f, and VC2d through the first contact plugs CT1a-CT1f.

The second bit line BL2 may be connected to the first, sixth, and fourth types of the first vertical channels VC1a, VC1f, and VC1d and the third, fifth, and second types of the second vertical channels VC2c, VC2e, and VC2b through the second contact plugs CT2a-CT2f.

The third bit line BL3 may be connected to the fourth, sixth, and first types of the first vertical channels VC1d, VC1f, and VC1a and the second, fifth, and third types of the second vertical channels VC2b, VC2e, and VC2c through the third contact plugs CT3a-CT3f.

The fourth bit line BL4 may be connected to the second, fifth, and third types of the first vertical channels VC1b, VC1e, and VC1c and the fourth, sixth, and first types of the second vertical channels VC2d, VC2f, and VC2a through the fourth contact plugs CT4a-CT4f.

Figure 11:
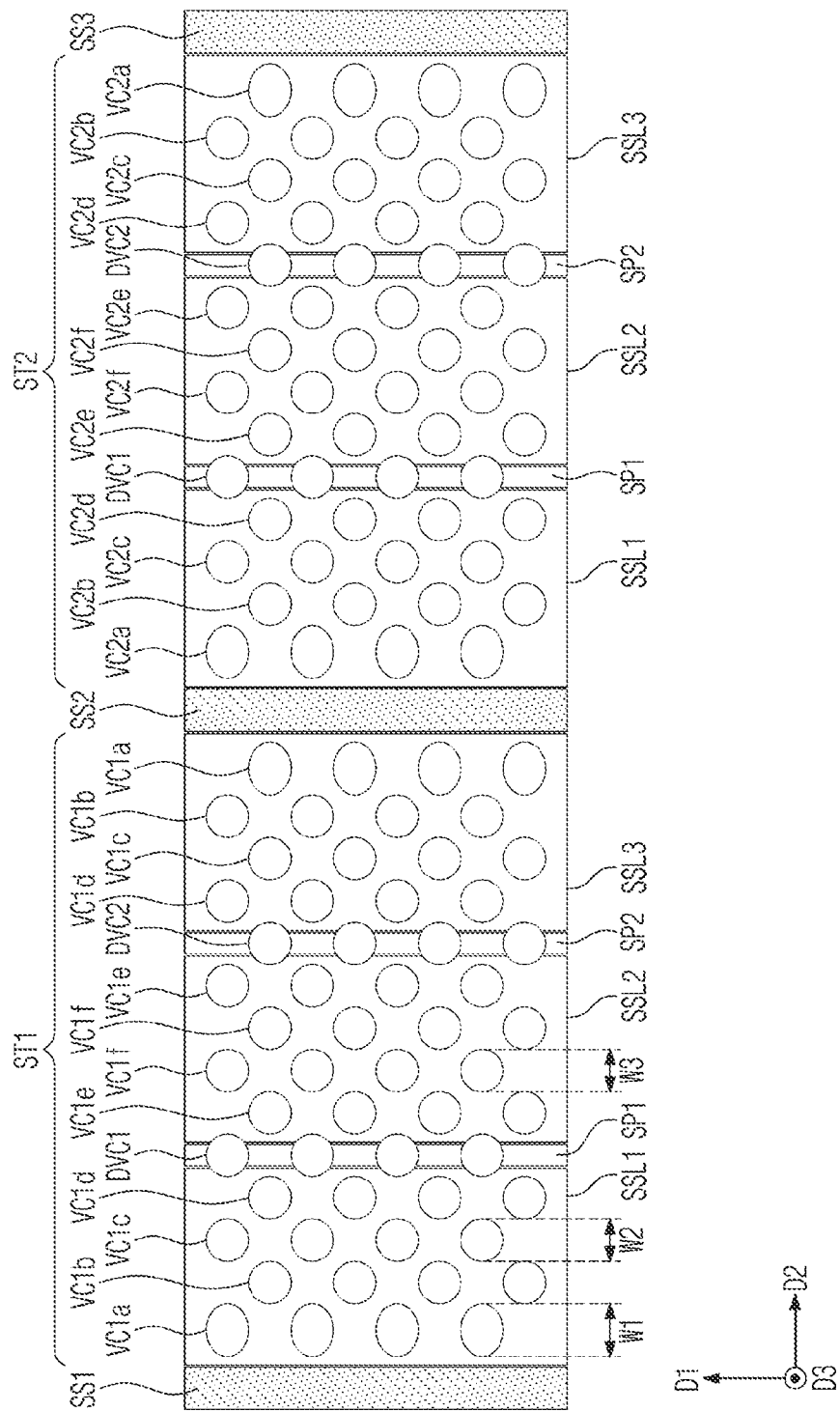
FIGS. 11, 12, and 13 are plan views each illustrating an arrangement of vertical channels of a semiconductor device according to an embodiment of the disclosures.
Figure 12:
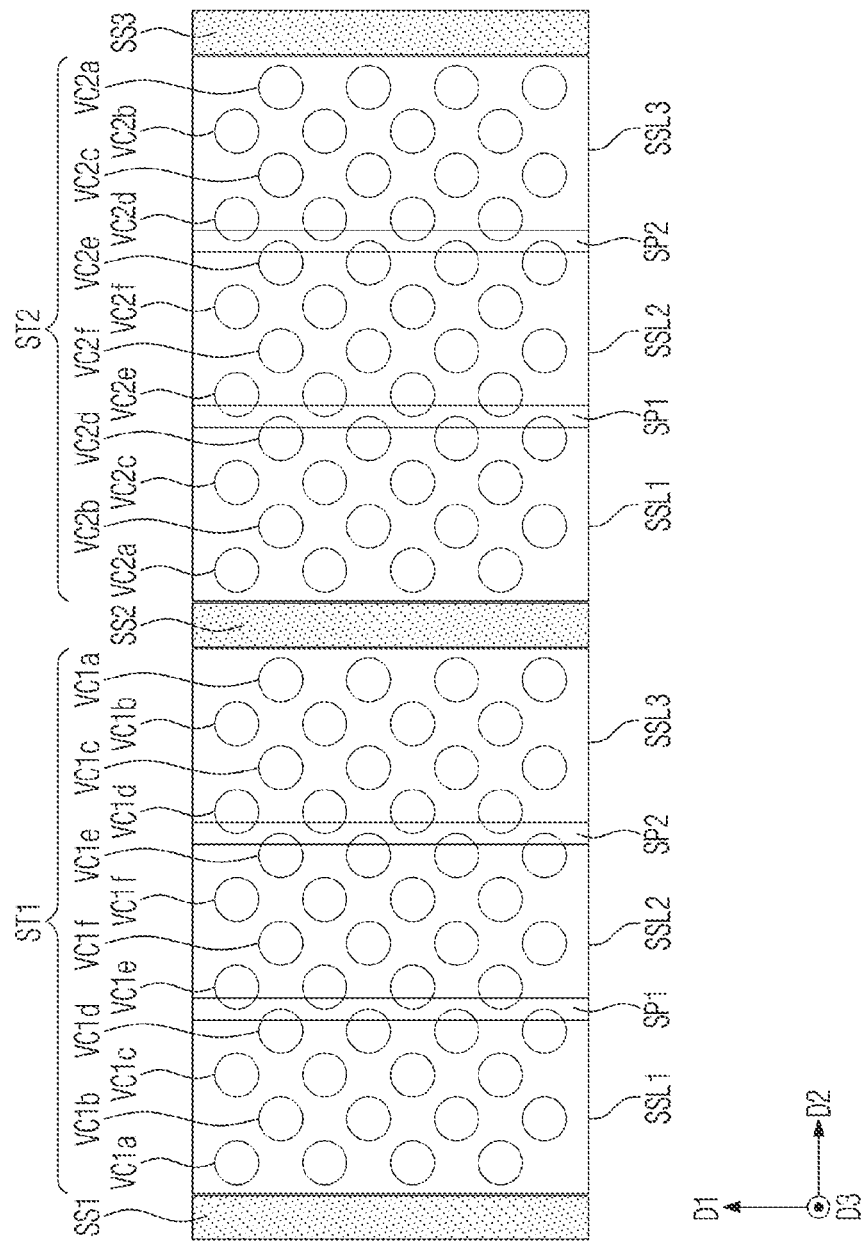
Figure 13:
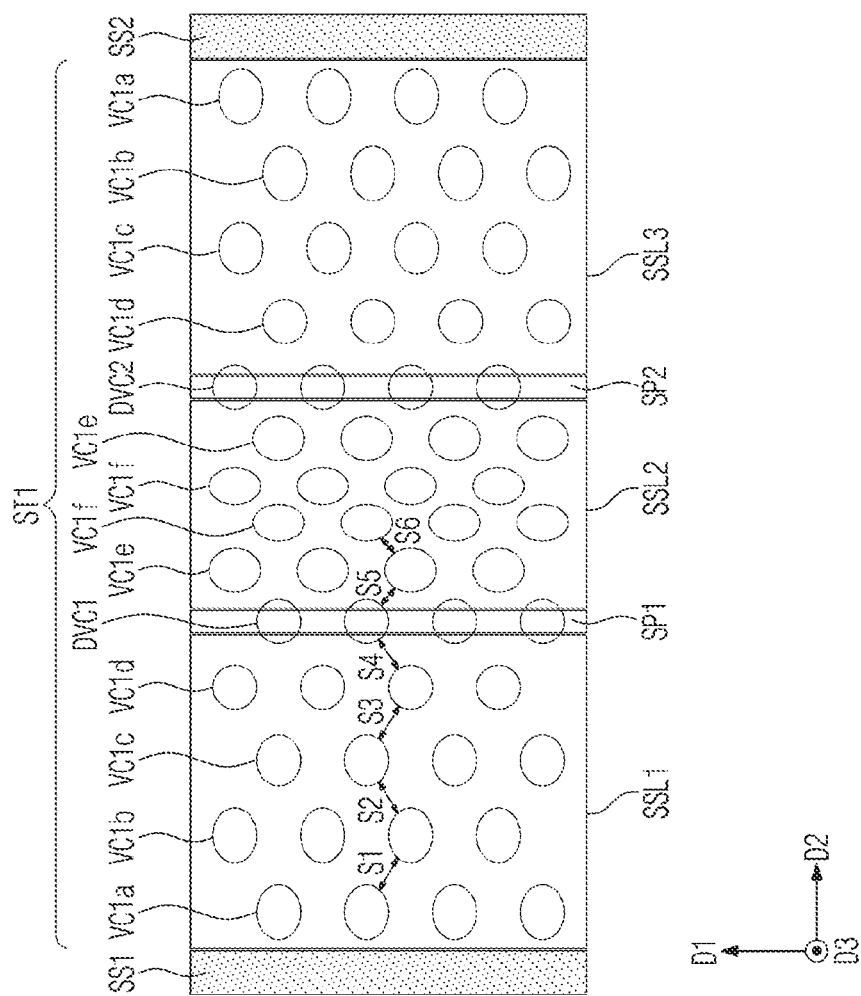

FIGS. 11, 12, and 13 are plan views each illustrating an arrangement of vertical channels of a semiconductor device according to an embodiment of the disclosures.

According to the embodiment shown in FIG. 11, unlike the embodiment of FIG. 6, the first to sixth types of the first or second the vertical channels VC1a-VC1f and VC2a-VC2f may have different diameters from each other. For example, the diameter of the first type of the first vertical channels VC may be larger than the diameter of the sixth type of the first vertical channels VC1f.

As an example, the first type of the first vertical channels VC1a may have a first diameter W1, and the third type of the first vertical channels VC1c may have a second diameter W2 smaller than the first diameter W1. The sixth type of the first vertical channels VC1f may have a third diameter W3 smaller than the first diameter W1. Here, the third diameter W3 may be substantially equal to or different from the second diameter W2.

As another example, the first type of the first vertical channels VC1a may have a first diameter W1, and the third type of the first vertical channels VC1c may have a second diameter W2 smaller than the first diameter W1. The sixth type of the first vertical channels VC1f may have a third diameter W3 smaller than the second diameter W2.

As other example, diameters of the first or second vertical channels VC1a-VC1f or VC2a-VC2f may decrease with increasing distance from each separation structure SS1, SS2, or SS3.

According to the embodiment shown in FIG. 12, the first and second dummy vertical channels penetrating the first and second stacks ST1 and ST2 may be omitted, unlike the embodiment of FIG. 6. In this case, twelve columns of the vertical channels VC1a-VC1f and VC2a-VC2f may be provided in each of the first and second stacks ST1 and ST2.

Each of the first and second stacks ST1 and ST2 may include the first and second upper separation patterns SP1 and SP2 separating the first, second, and third upper electrodes SSL1, SSL2, and SSL3 from each other. Here, the first and second upper separation patterns SP1 and SP2 may be respectively disposed between the fourth and fifth types of the first vertical channels VC1d and VC1e and between the fourth and fifth types of the second vertical channels VC2d and VC2e.

According to the embodiment shown in FIG. 13, unlike the embodiment of FIG. 6, diameters of the vertical channels VC1a-VC1f and VC2a-VC2f may decrease with increasing distance from each separation structure SS1, SS2, or SS3, and distances between adjacent ones of the vertical channels VC1a-VC1f and VC2a-VC2f may also decrease with increasing distance from each separation structure SS1, SS2, or SS3 (i.e., S1>S2>S3>S4>S5>S6).

Figure 14:
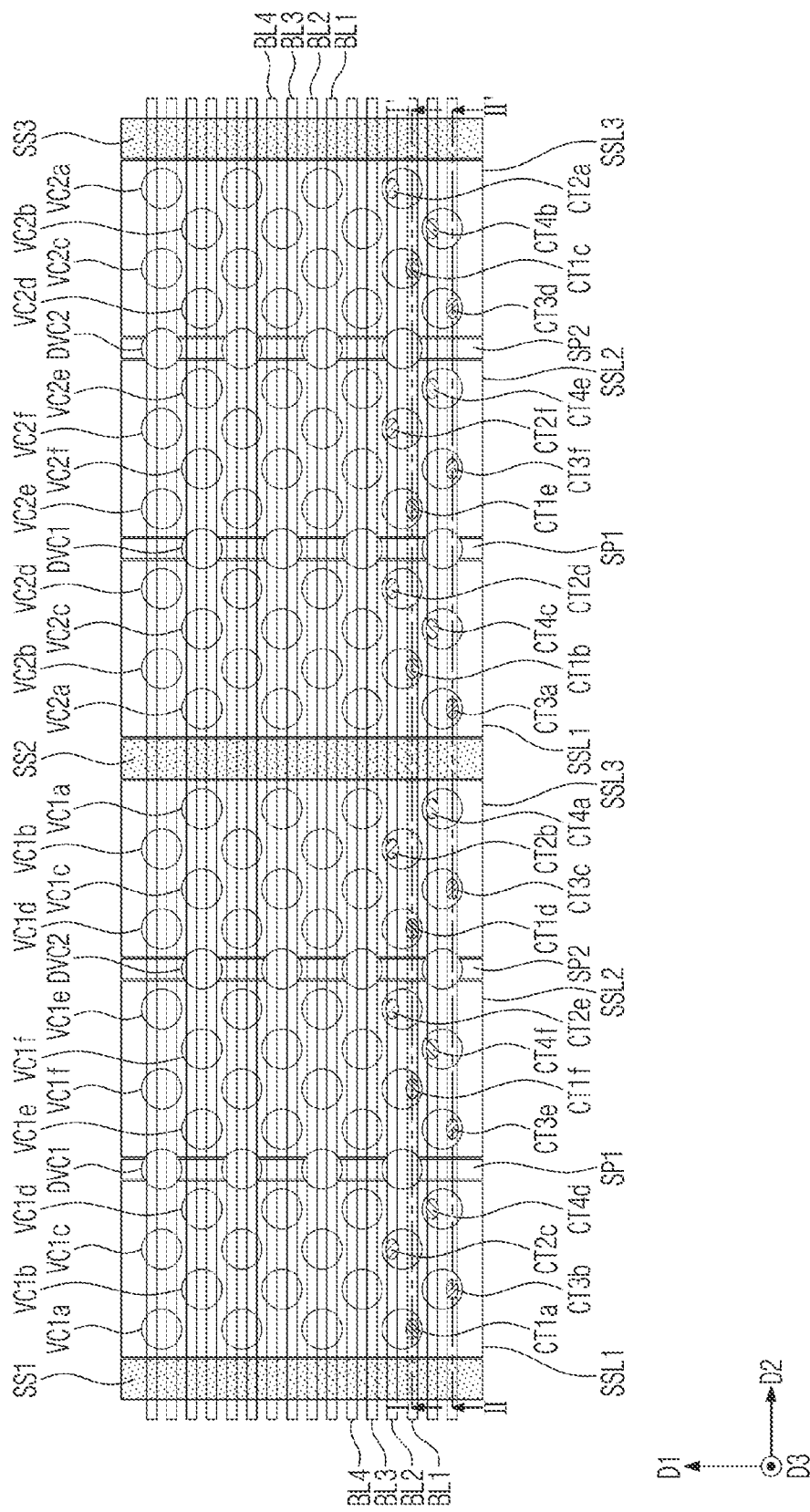
FIG. 14 is a plan view illustrating a portion of a semiconductor device according to an embodiment of the disclosure.
Figure 15:
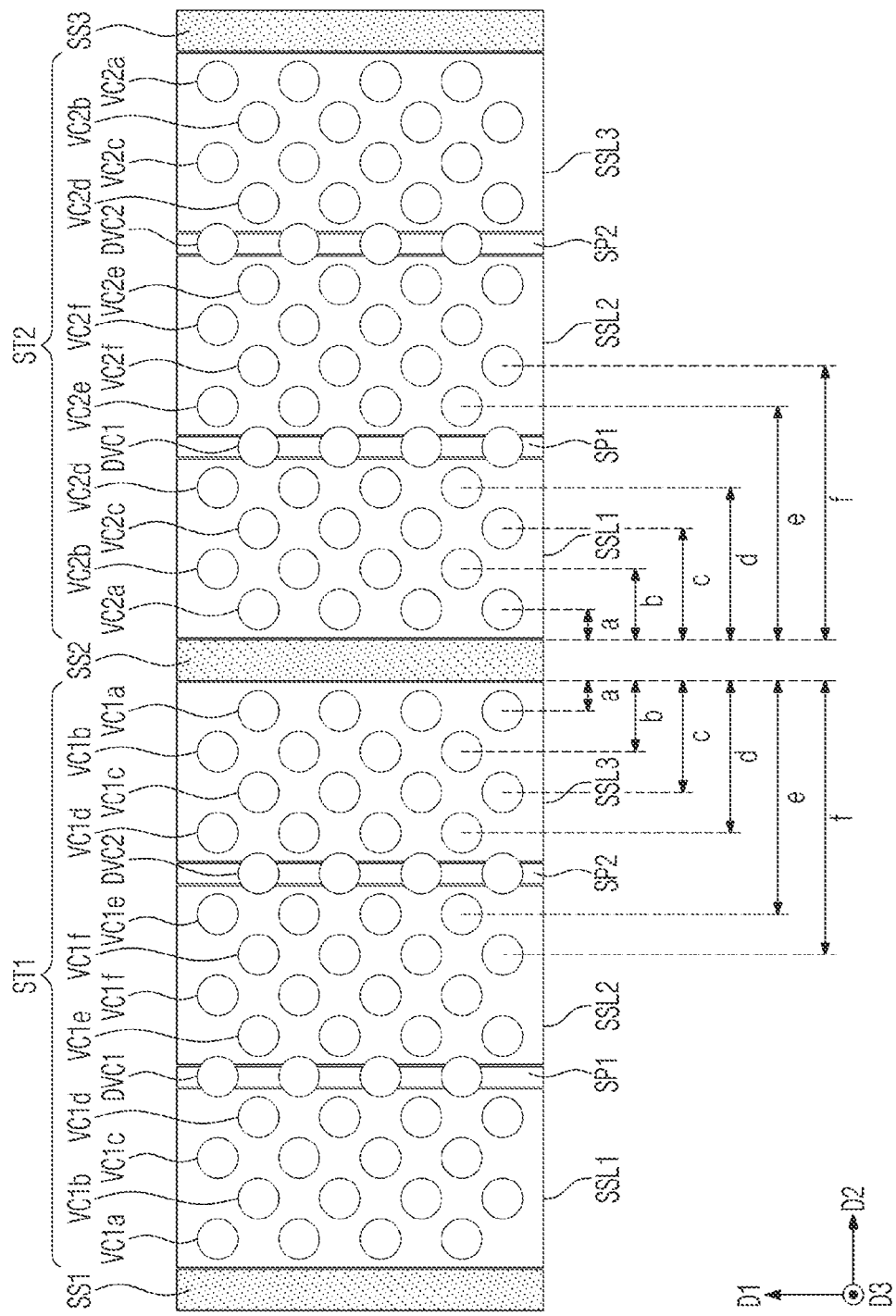
FIG. 15 is a plan view illustrating an arrangement of vertical channels of a semiconductor device according to an embodiment of the disclosure.
Figure 16A:
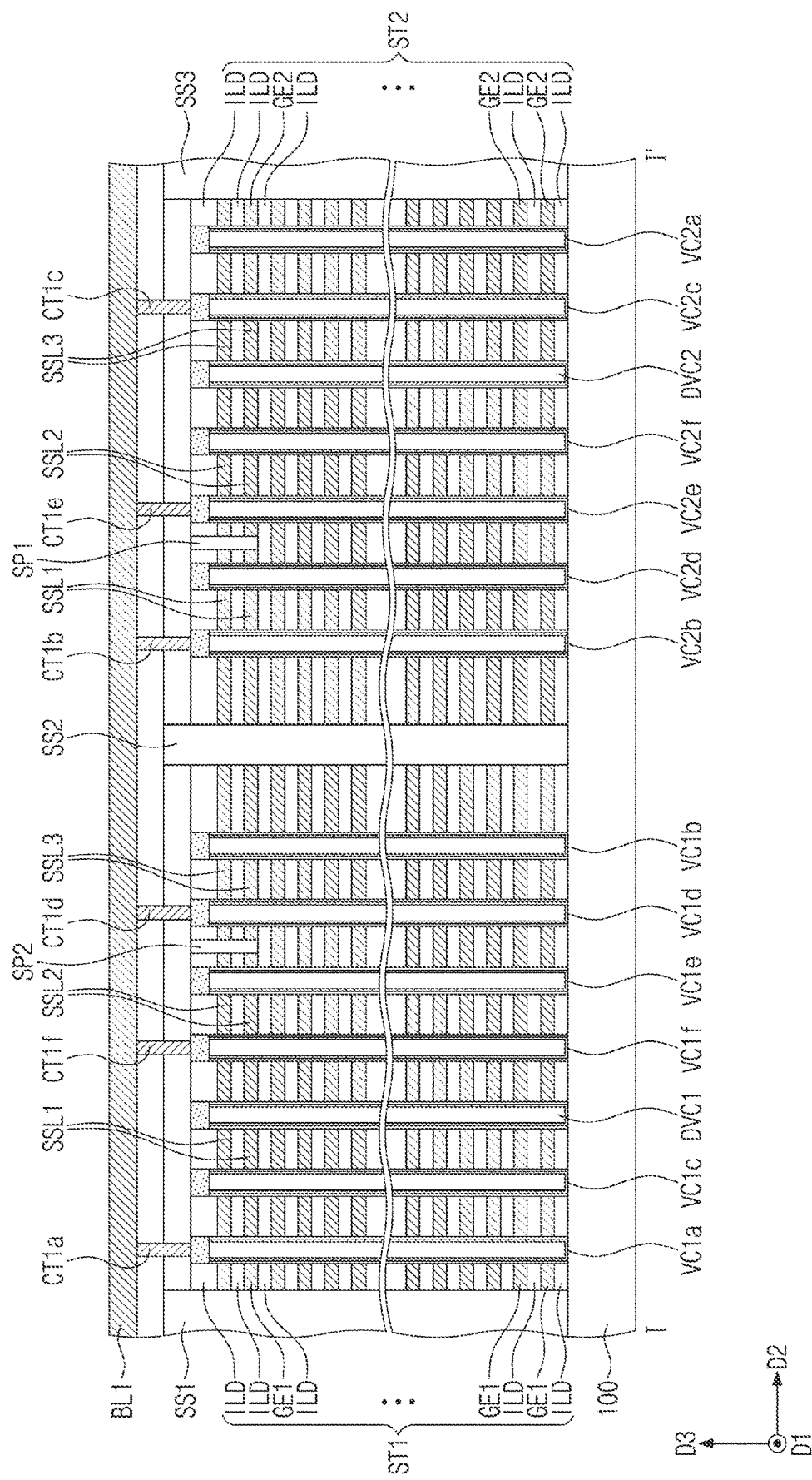
FIGS. 16A and 16B are sectional views which are respectively taken along lines I-I' and II-II' of FIG. 14 to illustrate a semiconductor device according to an embodiment of the disclosure.
Figure 16B:
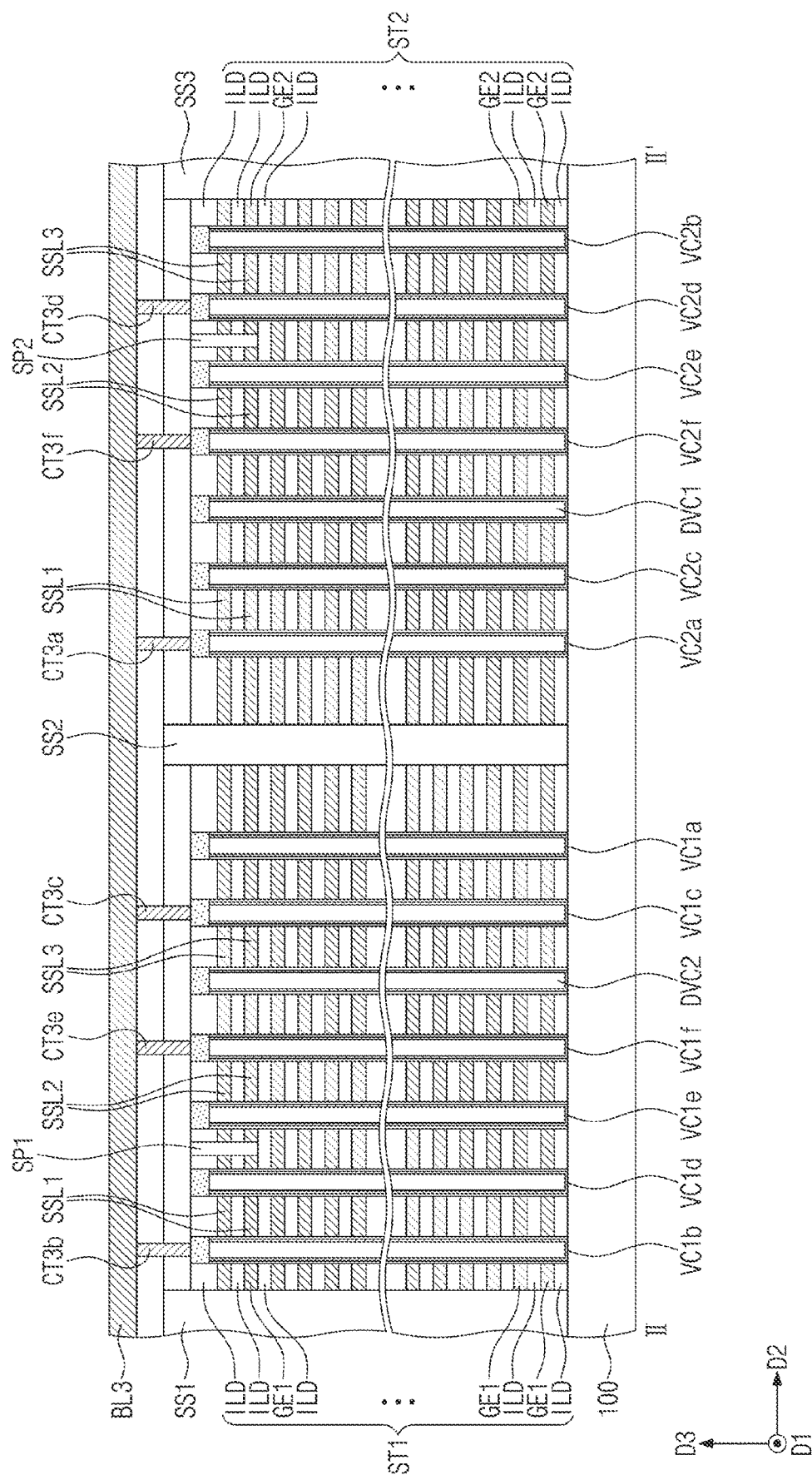

FIG. 14 is a plan view illustrating a portion of a semiconductor device according to an embodiment of the disclosure. FIG. 15 is a plan view illustrating an arrangement of vertical channels of a semiconductor device according to an embodiment of the disclosure. FIGS. 16A and 16B are sectional views which are respectively taken along lines I-I' and II-II' of FIG. 14 to illustrate a semiconductor device according to an embodiment of the disclosure.

According to the embodiment shown in FIGS. 14, 15, 16A, and 16B, the first vertical channels VC1a-VC1f and the second vertical channels VC2a-VC2f may be provided to have a mirror symmetry about the second separation structure SS2, unlike the embodiment of FIGS. 5 and 6.

In other words, the first type of the first vertical channels VC1a, which are most adjacent to the second separation structure SS2, may be spaced apart from the first type of the second vertical channels VC2a, which are most adjacent to the second separation structure SS2, in the second direction D2.

The first bit line BL1 may be connected to the first, sixth, and fourth types of the first vertical channels VC1a, VC1f, and VC1d and the second, fifth, and third types of the second vertical channels VC2b, VC2e, and VC2c in order through the first contact plugs CT1a, CT1f, CT1d, CT1b, CT1e, and CT1c.

The second bit line BL2 may be connected to the third, fifth, and second types of the first vertical channels VC1c, VC1e, and VC1b and the fourth, sixth, and first types of the second vertical channels VC2d, VC2f, and VC2a in order through the second contact plugs CT2c, CT2e, CT2b, CT2d, CT2f, and CT2a.

The third bit line BL3 may be connected to the second, fifth, and third types of the first vertical channels VC1b, VC1e, and VC1c and the first, sixth, and fourth types of the second vertical channels VC2a, VC2f, and VC2d in order through the third contact plugs CT3b, CT3e, CT3c, CT3a, CT3f, and CT3d.

The fourth bit line BL4 may be connected to the fourth, sixth, and first types of the first vertical channels VC1d, VC1f, and VC1a and the third, fifth, and second types of the second vertical channels VC2c, VC2e, and VC2b in order through the fourth contact plugs CT4d, CT4f, CT4a, CT4c, CT4e, and CT4b.

Figure 17:
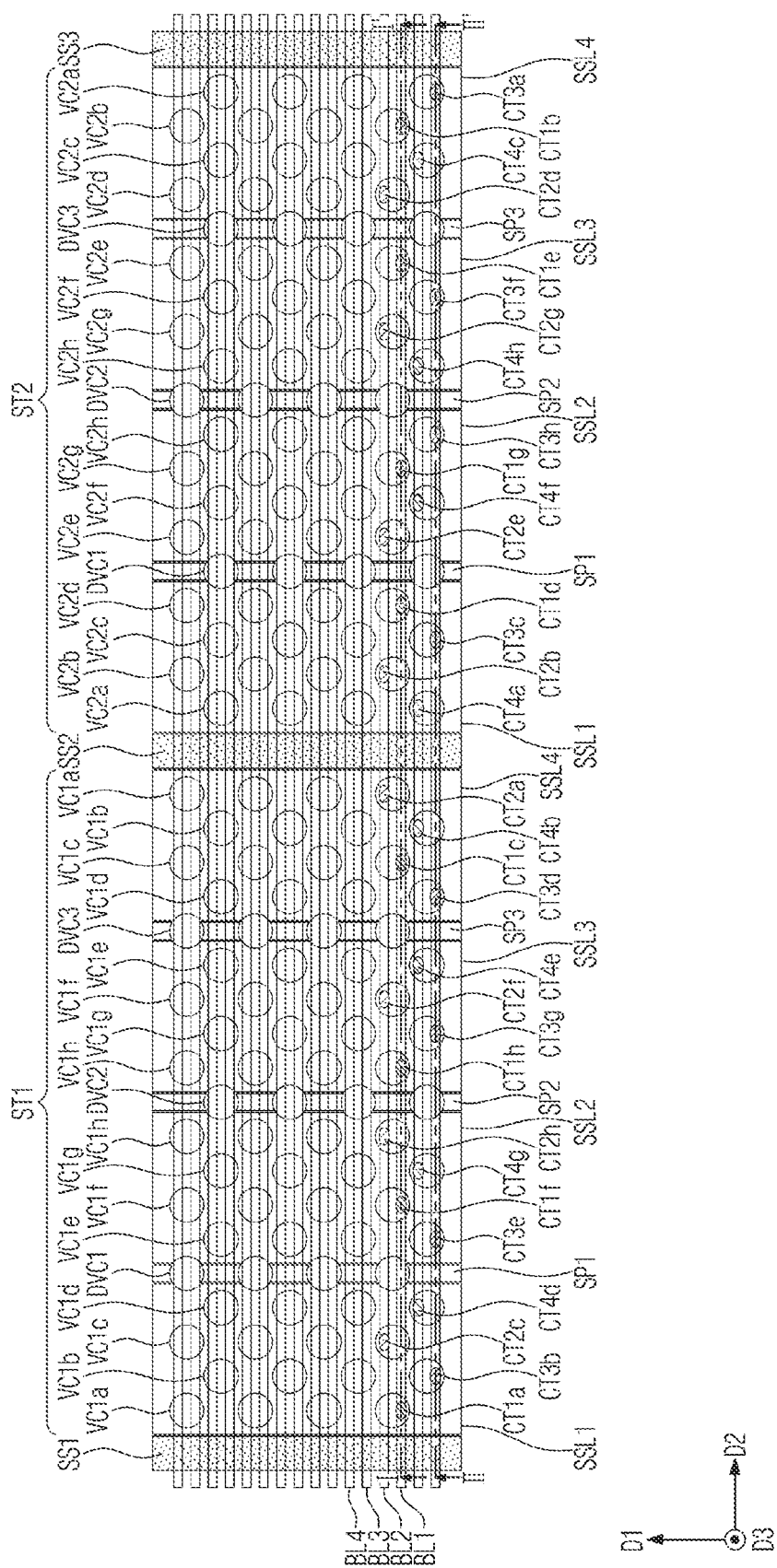
FIG. 17 is a plan view illustrating a portion of a semiconductor device according to an embodiment of the disclosure.
Figure 18:
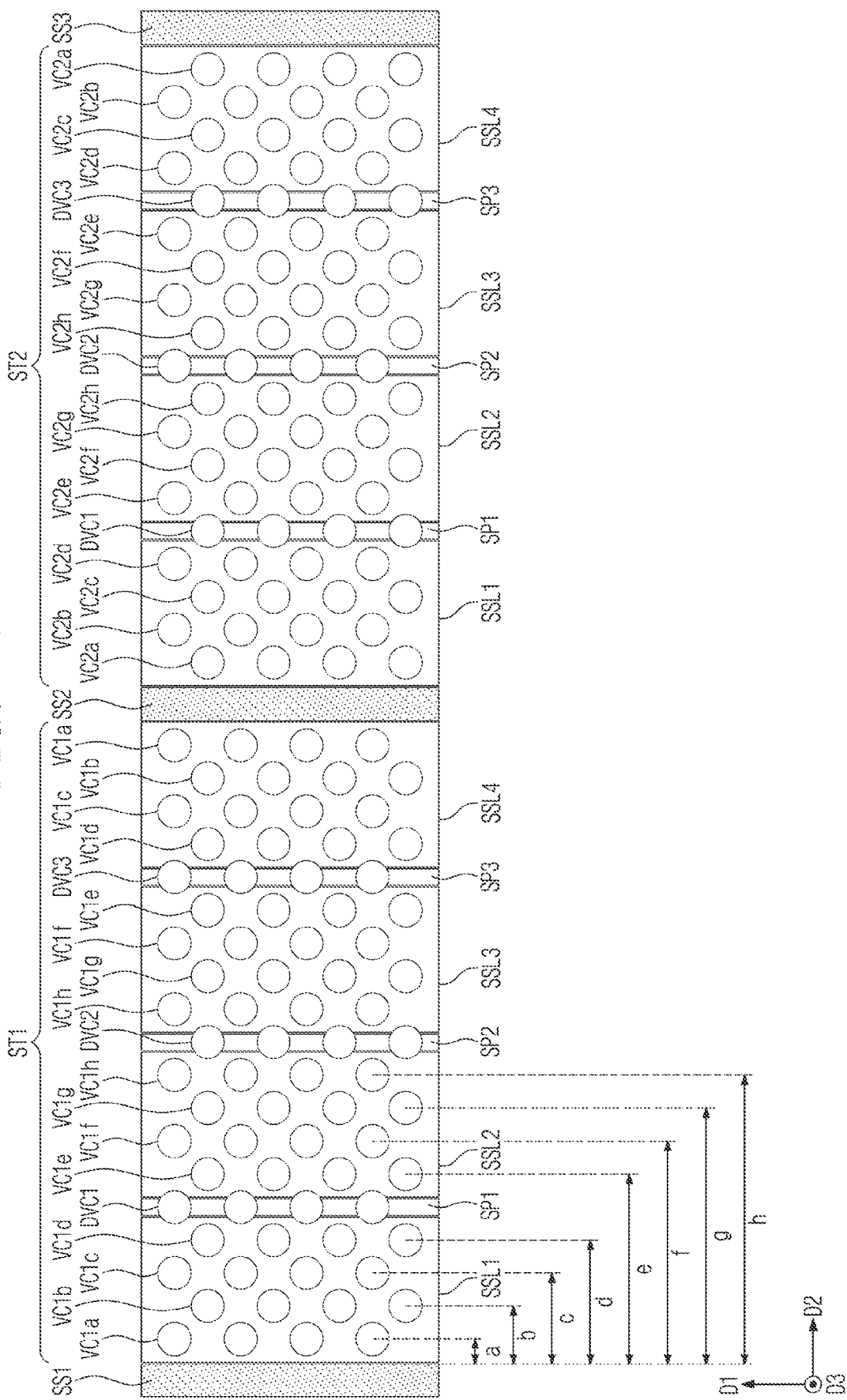
FIG. 18 is a plan view illustrating an arrangement of vertical channels of a semiconductor device according to an embodiment of the disclosure.
Figure 19A:
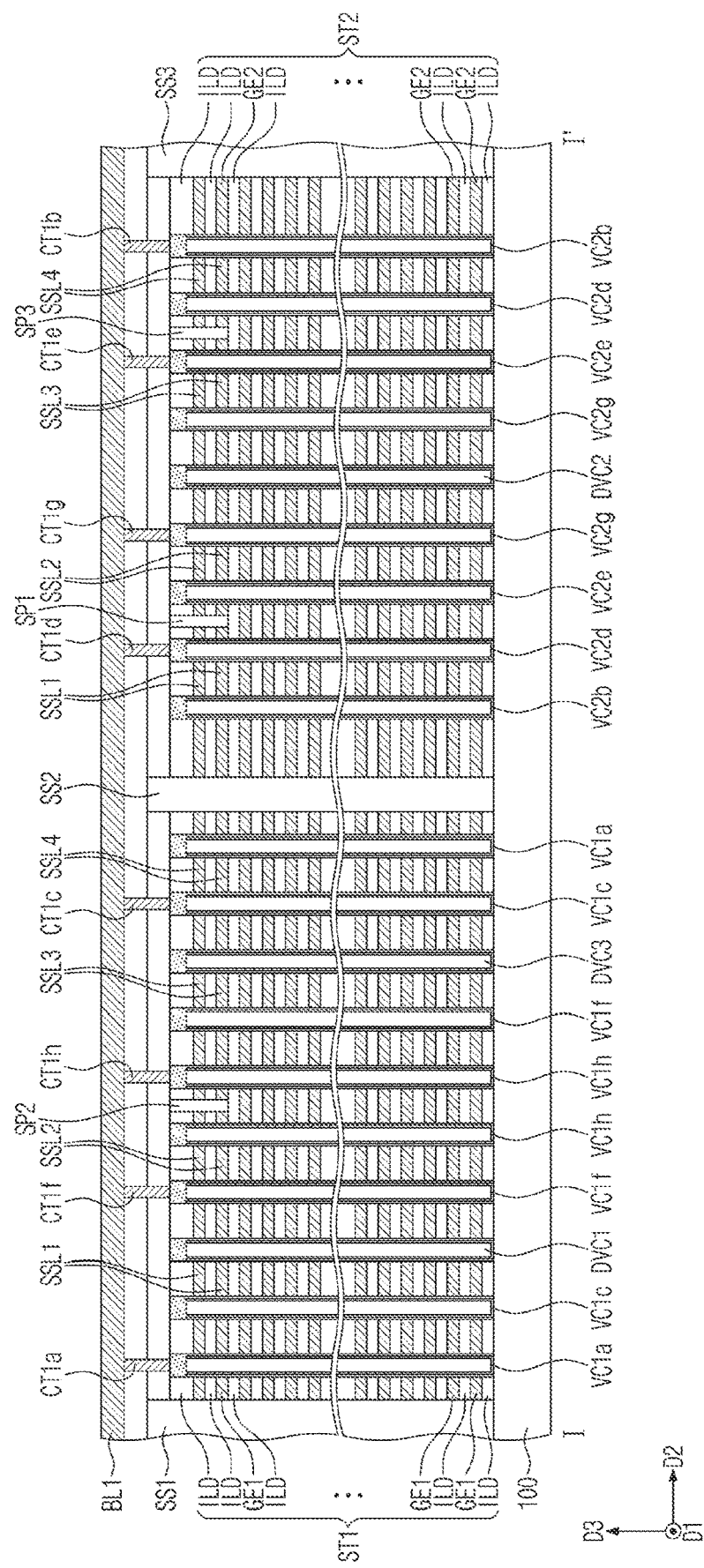
FIGS. 19A and 19B are sectional views which are respectively taken along lines I-I' and II-II' of FIG. 17 to illustrate a semiconductor device according to an embodiment of the disclosure.
Figure 19B:
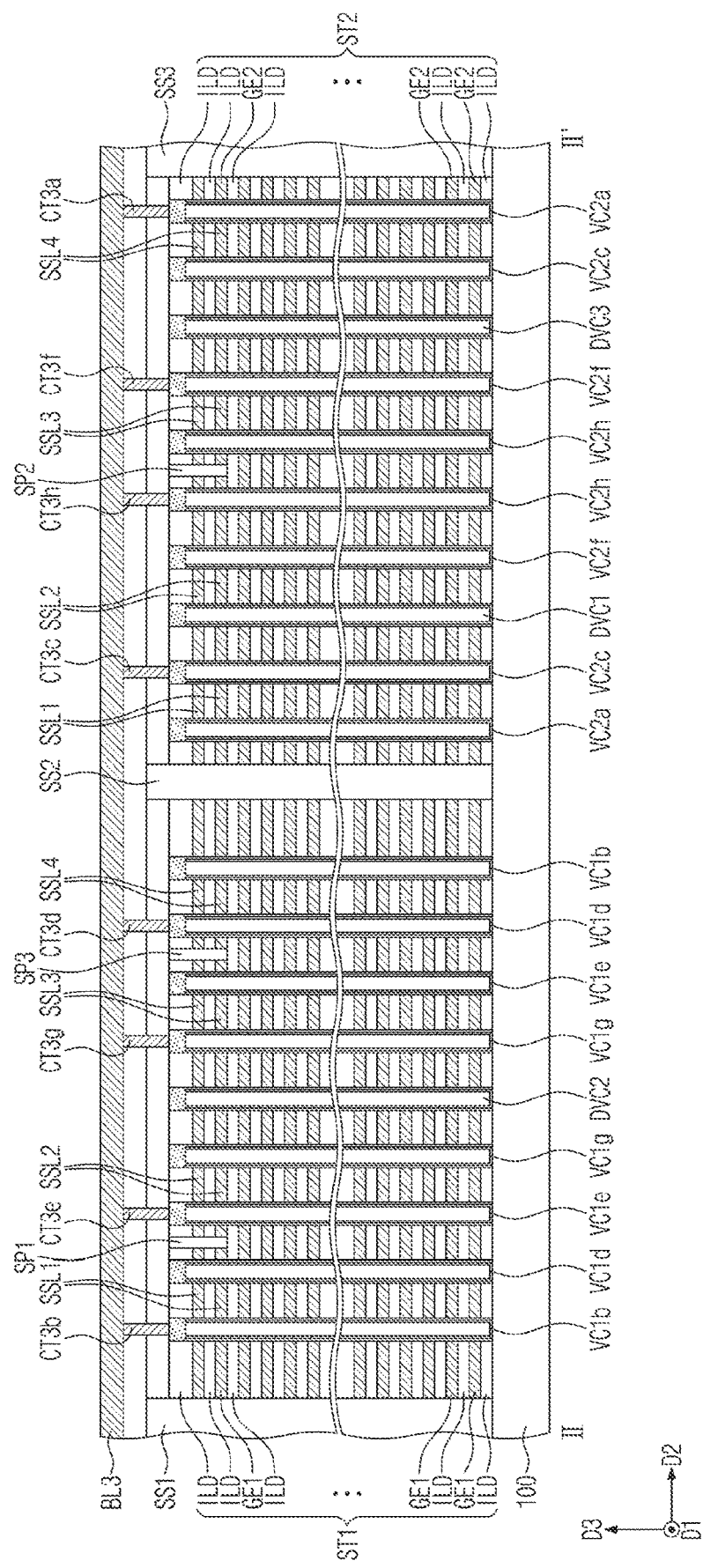

FIG. 17 is a plan view illustrating a portion of a semiconductor device according to an embodiment of the disclosure. FIG. 18 is a plan view illustrating an arrangement of vertical channels of a semiconductor device according to an embodiment of the disclosure. FIGS. 19A and 19B are sectional views which are respectively taken along lines I-I' and II-II' of FIG. 17 to illustrate a semiconductor device according to an embodiment of the disclosure.

According to the embodiment shown in FIGS. 17, 18, 19A, and 19B, unlike the embodiment of FIGS. 5 and 6, each of the first and second stacks ST1 and ST2 may include first, second, third, and fourth upper electrodes SSL1, SSL2, SSL3, and SSL4 and first, second, and third upper separation patterns SP1, SP2, and SP3, which are provided to horizontally separate the first to fourth upper electrodes SSL1-SSL4 from each other.

Nineteen columns of the vertical channels VC1a-VC1h, DVC1, DVC2, and DVC3 may be provided in the first stack ST1. Nineteen columns of the second vertical channels VC2a-VC2h, DVC1, DVC2, and DVC3 may be provided in the second stack ST2. In an embodiment, the first vertical channels VC1a-VC1h may be classified into eight types, depending on a distance from the first and second separation structures SS1 and SS2 in the second direction D2. The second vertical channels VC2a-VC2h may be classified into eight types, depending on a distance from the second and third separation structures SS2 and SS3 in the second direction D2.

In detail, the first to eighth types of the first vertical channels VC1a-VC1h may be sequentially arranged from the first separation structure SS1 in order enumerated, and the first to eighth types of the first vertical channels VC1a-VC1h may be sequentially arranged from the second separation structure SS2 in order enumerated. The first to eighth types of the second vertical channels VC2a-VC2h may be sequentially arranged from the second separation structure SS2 in order enumerated, and the first to eighth types of the second vertical channels VC2a-VC2h may be sequentially arranged from the third separation structure SS3 in order enumerated.

The first to eighth types of the first vertical channels VC1a-VC1h may be arranged to be spaced apart from each of the first and second separation structures SS1 and SS2 by different distances a, b, c, d, e, f, g, and h. The first to eighth types of the second vertical channels VC2a-VC2h may be arranged to be spaced apart from each of the second and third separation structures SS2 and SS3 by different distances a, b, c, d, e, f, g, and h.

In an embodiment, the first type of the second vertical channels VC2a may be spaced apart from the first type of the first vertical channels VC1a, in a diagonal direction, with the second separation structure SS2 interposed therebetween. The arrangement of the second vertical channels VC2a-VC2f penetrating the second stack ST2 may be substantially the same as that of the first vertical channels VC1a-VC1f.

In detail, the first type of the first vertical channels VC1a may be spaced apart from the first and second separation structures SS1 and SS2 by the first distance a. The second type of the first vertical channels VC1b may be spaced apart from the first and second separation structures SS1 and SS2 by the second distance b larger than the first distance a. The third type of the first vertical channels VC1c may be spaced apart from the first and second separation structures SS1 and SS2 by the third distance c larger than the second distance b. The fourth type of the first vertical channels VC1d may be spaced apart from the first and second separation structures SS1 and SS2 by the fourth distance d larger than the third distance c. The fifth type of the first vertical channels VC1e may be spaced apart from the first and second separation structures SS1 and SS2 by the fifth distance e larger than the fourth distance d. The sixth type of the first vertical channels VC1f may be spaced apart from the first and second separation structures SS1 and SS2 by the sixth distance f larger than the fifth distance e.

The seventh type of first vertical channels VC1g may be spaced apart from the first and second separation structures SS1 and SS2 by a seventh distance g larger than the sixth distance f. The eighth type of first vertical channels VC1h may be spaced apart from the first and second separation structures SS1 and SS2 by an eighth distance h larger than the seventh distance g.

In addition, the first dummy vertical channels DVC1 may be disposed between the fourth and fifth types of the first vertical channels VC1d and VC1e and may penetrate the first upper separation pattern SP1 and the first electrodes GE1, between the first and second upper electrodes SSL1 and SSL2.

The second dummy vertical channels DVC2 may be disposed between the eighth type of the first vertical channels VC1h, which are adjacent to each other in the second direction D2, and may penetrate the second upper separation pattern SP2 and the first electrodes GE1, between the second and third upper electrodes SSL2 and SSL3.

Third dummy vertical channels DVC3 may be disposed between the fourth and fifth types of the first vertical channels VC1d and VC1e and may penetrate the third upper separation pattern SP3 and the first electrodes GE1, between the third and fourth upper electrodes SSL3 and SSL4.

As described above, each of the first to fourth bit lines BL1-BL4 may be connected to all types of the vertical channels VC1a-VC1h and VC2a-VC2h through the contact plugs CT1a-CT1h, CT2a-CT2h, CT3a-CT3h, and CT4a-CT4h. The first to fourth bit lines BL1-BL4 may be provided to cross over the first to third dummy vertical channels DVC1-DVC3 but may be electrically separated from the first to third dummy vertical channels DVC1-DVC3.

As an example, the first bit line BL1 may be connected to the first, sixth, eighth, and third types of the first vertical channels VC1a, VC1f, VC1h, and VC1c in order through the first contact plugs CT1a, CT1f, CT1h, and CT1c. In addition, the fourth, seventh, fifth, and second types of the second vertical channels VC2d, VC2g, VC2e, and VC2b may be connected to the first bit line BL1 through the first contact plugs CT1d, CT1g, CT1e, and CT1b.

The second bit line BL2 may be connected to the third, eighth, sixth, and first types of the first vertical channels VC1c, VC1h, VC1f, and VC1a in order through the second contact plugs CT2c, CT2h, CT2f, and CT2a. In addition, the second, fifth, seventh, fourth types of the second vertical channels VC2b, VC2e, VC2g, and VC2d may be connected to the second bit line BL2 through the second contact plugs CT2b, CT2e, CT2g, and CT2d.

The third bit line BL3 may be connected to the second, fifth, seventh, and fourth types of the first vertical channels VC1b, VC1e, VC1g, and VC1d in order through the third contact plugs CT3b, CT3e, CT3g, and CT3d. In addition, the third, eighth, sixth, and first types of the second vertical channels VC2c, VC2h, VC2f, and VC2a may be connected to the third bit line BL3 through the third contact plugs CT3c, CT3h, CT3f, and CT3a.

The fourth bit line BL4 may be connected to the fourth, seventh, fifth, and second types of the first vertical channels VC1d, VC1g, VC1e, and VC1b in order through the fourth contact plugs CT4d, CT4g, CT4e, and CT4b. In addition, the first, sixth, eighth, and third types of the second vertical channels VC2a, VC2f, VC2h, and VC2c may be connected to the fourth bit line BL4 through the fourth contact plugs CT4a, CT4f, CT4h, and CT4c.

Figure 20:
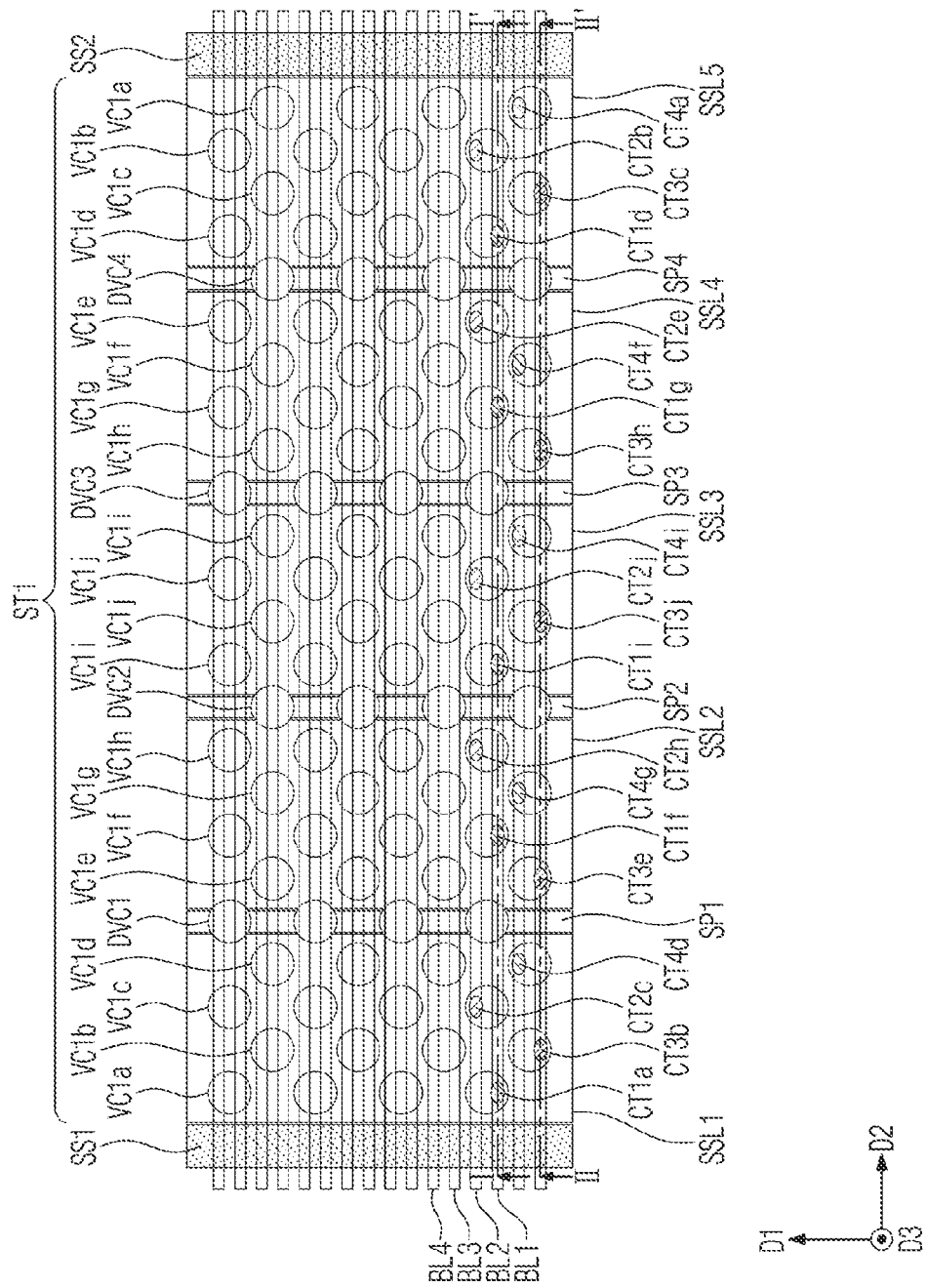
FIG. 20 is a plan view illustrating a portion of a semiconductor device according to an embodiment of the disclosure.
Figure 22A:
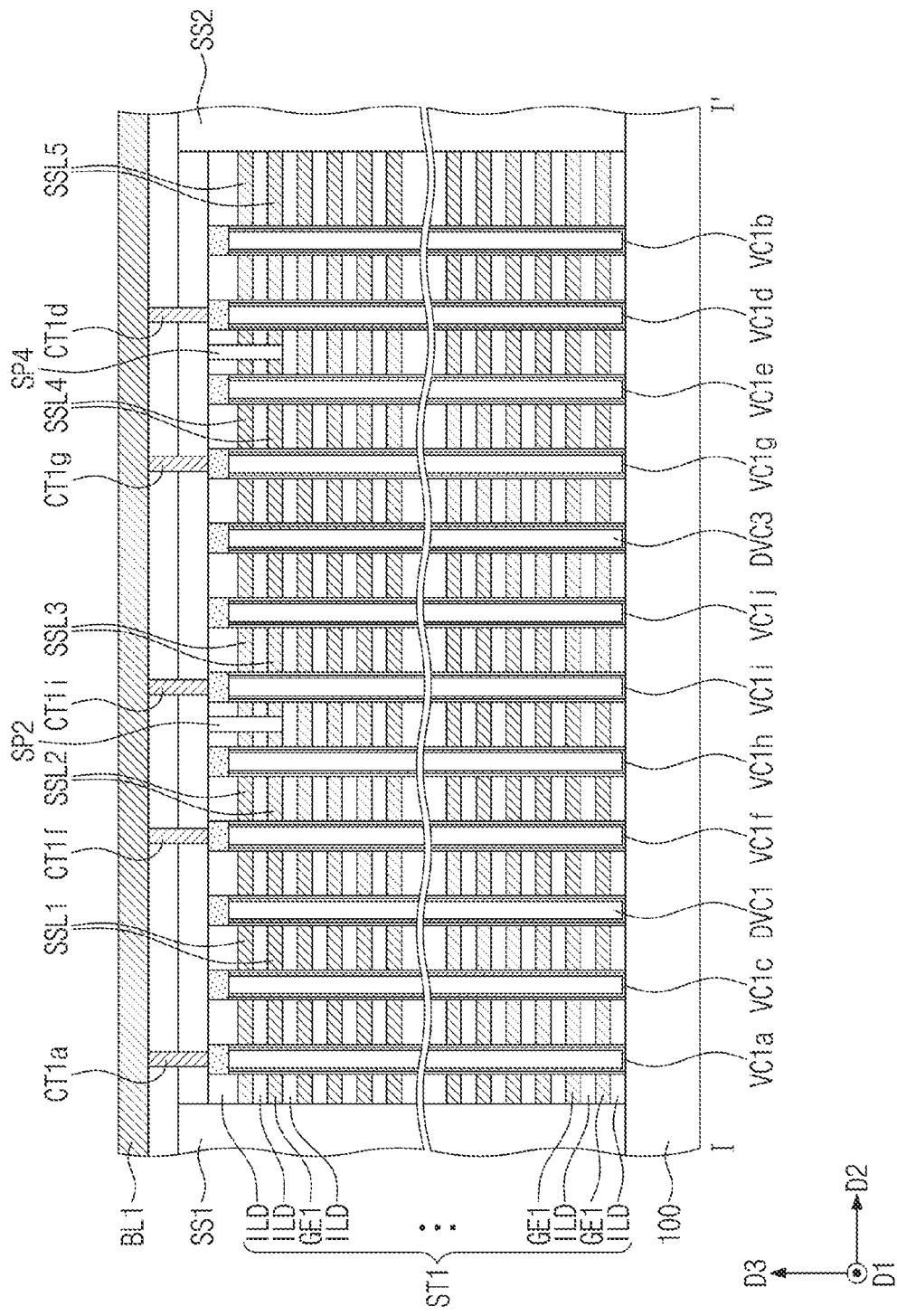
FIGS. 22A and 22B are sectional views which are respectively taken along lines I-I' and II-II' of FIG. 20 to illustrate a semiconductor device according to an embodiment of the disclosure.
Figure 22B:
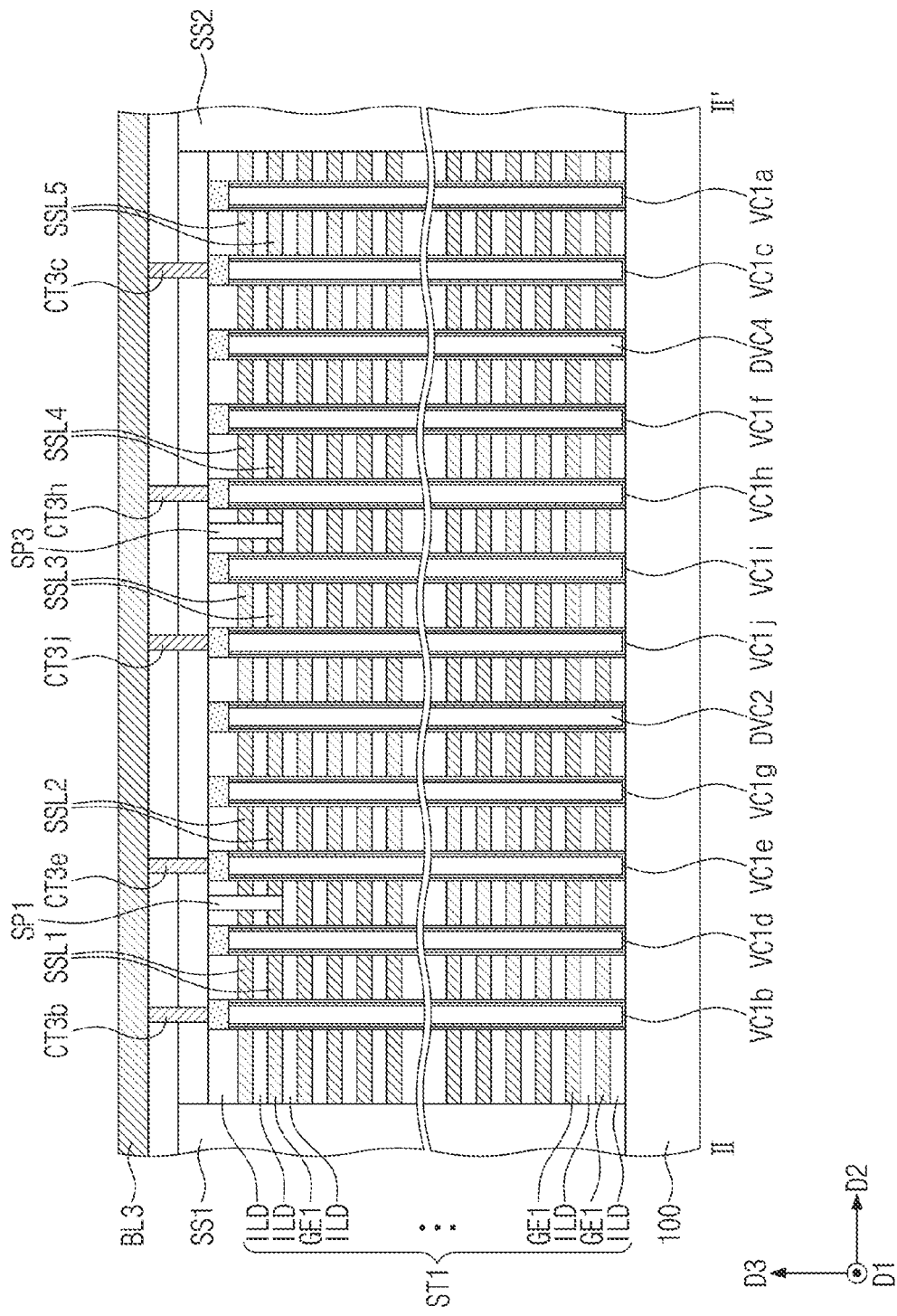

FIG. 20 is a plan view illustrating a portion of a semiconductor device according to an embodiment of the disclosure. FIG. 21 is a plan view illustrating an arrangement of vertical channels of a semiconductor device according to an embodiment of the disclosure. FIGS. 22A and 22B are sectional views which are respectively taken along lines I-I' and II-II' of FIG. 20 to illustrate a semiconductor device according to an embodiment of the disclosure.

According to the embodiment shown in FIGS. 20, 21, 22A, and 22B, unlike the embodiment of FIGS. 5 and 6, each stack ST1 may include first, second, third, fourth, and fifth upper electrodes SSL1, SSL2, SSL3, SSL4, and SSL5 and first, second, third, and fourth upper separation patterns SP1, SP2, SP3, and SP4, which are provided to horizontally separate the first to fifth upper electrodes SSL1-SSL5 from each other.

Twenty four columns of the vertical channels VC1a-VC1j, DVC1, DVC2, DVC3, and DVC4 may be provided in each stack ST1. In an embodiment, the vertical channels VC1a-VC1j may be classified into ten types, depending on a distance from each separation structure SS1, SS2, or SS3 in the second direction D2.

In detail, the first to tenth types of the first vertical channels VC1a-VC1j may be sequentially arranged from the first separation structure SS1 in order enumerated and the first to tenth types of the first vertical channels VC1a-VC1j may be sequentially arranged from the second separation structure SS2 in order enumerated.

The first to tenth types of the first vertical channels VC1a-VC1j may be spaced apart from each of the separation structures SS1 and SS2 by different distances a, b, c, d, e, f, g, h, i, and j.

The first type of the first vertical channels VC1a may be spaced apart from the first and second separation structures SS1 and SS2 by a first distance a. The second type of the first vertical channels VC1b may be spaced apart from the first and second separation structures SS1 and SS2 by a second distance b larger than the first distance a. The third type of the first vertical channels VC1c may be spaced apart from the first and second separation structures SS1 and SS2 by a third distance c larger than the second distance b. The fourth type of the first vertical channels VC1d may be spaced apart from the first and second separation structures SS1 and SS2 by a fourth distance d larger than the third distance c. The fifth type of the first vertical channels VC1e may be spaced apart from the first and second separation structures SS1 and SS2 by a fifth distance e larger than the fourth distance d. The sixth type of the first vertical channels VC1f may be spaced apart from the first and second separation structures SS1 and SS2 by a sixth distance f larger than the fifth distance e.

The seventh type of the first vertical channels VC1g may be spaced apart from the first and second separation structures SS1 and SS2 by a seventh distance g larger than the sixth distance f. The eighth type of the first vertical channels VC1h may be spaced apart from the first and second separation structures SS1 and SS2 by an eighth distance h larger than the seventh distance g. The ninth type of the first vertical channels VC1i may be spaced apart from the first and second separation structures SS1 and SS2 by a ninth distance i larger than the eighth distance h. The tenth type of first vertical channels VC1j may be spaced apart from the first and second separation structures SS1 and SS2 by a tenth distance j larger than the ninth distance i.

In addition, first dummy vertical channels DVC1 may be disposed between the fourth and fifth types of the first vertical channels VC1d and VC1e and may penetrate the first upper separation pattern SP1 and the first electrodes GE1, between the first and second upper electrodes SSL1 and SSL2.

Second dummy vertical channels DVC2 may be disposed between the eighth and ninth types of the first vertical channels VC1h and VC1i and may penetrate the second upper separation pattern SP2 and the first electrodes GE1, between the second and third upper electrodes SSL2 and SSL3.

Third dummy vertical channels DVC3 may be disposed between the eighth and ninth types of the first vertical channels VC1h and VC1i and may penetrate the third upper separation pattern SP3 and the first electrodes GE1, between the third and fourth upper electrodes SSL3 and SSL4.

Fourth dummy vertical channels DVC4 may be disposed between the fourth and fifth types of the first vertical channels VC1d and VC1e and may penetrate the fourth upper separation pattern SP4 and the first electrodes GE1, between the fourth and fifth upper electrodes SSL4 and SSL5.

As described above, each of the first to fourth bit lines BL1-BL4 may be connected to all types of the vertical channels VC1a-VC1j and VC2a-VC2j through the contact plugs CT1a-CT1j, CT2a-CT2j, CT3a-CT3j, and CT4a-CT4j. The first to fourth bit lines BL1-BL4 may be provided to cross over the first to fourth dummy vertical channels DVC1-DVC4 but may be electrically separated from the first to fourth dummy vertical channels DVC1-DVC4.

As an example, the first bit line BL1 may be connected to the first, sixth, ninth, seventh, and fourth types of the first vertical channels VC1a, VC1f, VC1i, VC1g, and VC1d in order through the first contact plugs CT1a, CT1f, CT1i, CT1g, and CT1d of the first contact plugs CT1a-CT1j. In addition, the second vertical channels (not shown) of the remaining types, except for the first, sixth, ninth, seventh, and fourth types, may be connected to the first bit line BL1 through remaining ones of the first contact plugs CT1a-CT1j.

The second bit line BL2 may be connected to the third, eighth, tenth, fifth, and second types of the first vertical channels VC1c, VC1h, VC1j, VC1e, and VC1b in order through the second contact plugs CT2*c*, CT2*h*, CT2*j*, CT2*e*, and CT2*b* of the second contact plugs CT2*a*-CT2*j*. In addition, the second vertical channels (not shown) of the remaining types, except for the third, eighth, tenth, fifth, and second types, may be connected to the second bit line BL2 through remaining ones of the second contact plugs CT2*a*-CT2*j*.

The third bit line BL3 may be connected to the second, fifth, tenth, eighth, and third types of the first vertical channels VC1*b*, VC1*e*, VC1*j*, VC1*h*, and VC1*c* in order through the third contact plugs CT3*b*, CT3*e*, CT3*j*, CT3*h*, and CT3*c* of the third contact plugs CT3*a*-CT3*j*. In addition, the second vertical channels (not shown) of the remaining types, except for the second, fifth, tenth, eighth, and third types, may be connected to the third bit line BL3 through remaining ones of the third contact plugs CT3*a*-CT3*j*.

The fourth bit line BL4 may be connected to the fourth, seventh, ninth, sixth, and first types of the first vertical channels VC1*d*, VC1*g*, VC1*i*, VC1*f*, and VC1*a* in order through the fourth contact plugs CT4*d*, CT4*g*, CT4*i*, CT4*f*, and CT4*a* of the fourth contact plugs CT4*a*-CT4*j*. In addition, the second vertical channels (not shown) of the remaining types, except for the fourth, seventh, ninth, sixth, and first types, may be connected to the fourth bit line BL4 through remaining ones of the fourth contact plugs CT4*a*-CT4*j*.

Figure 23:
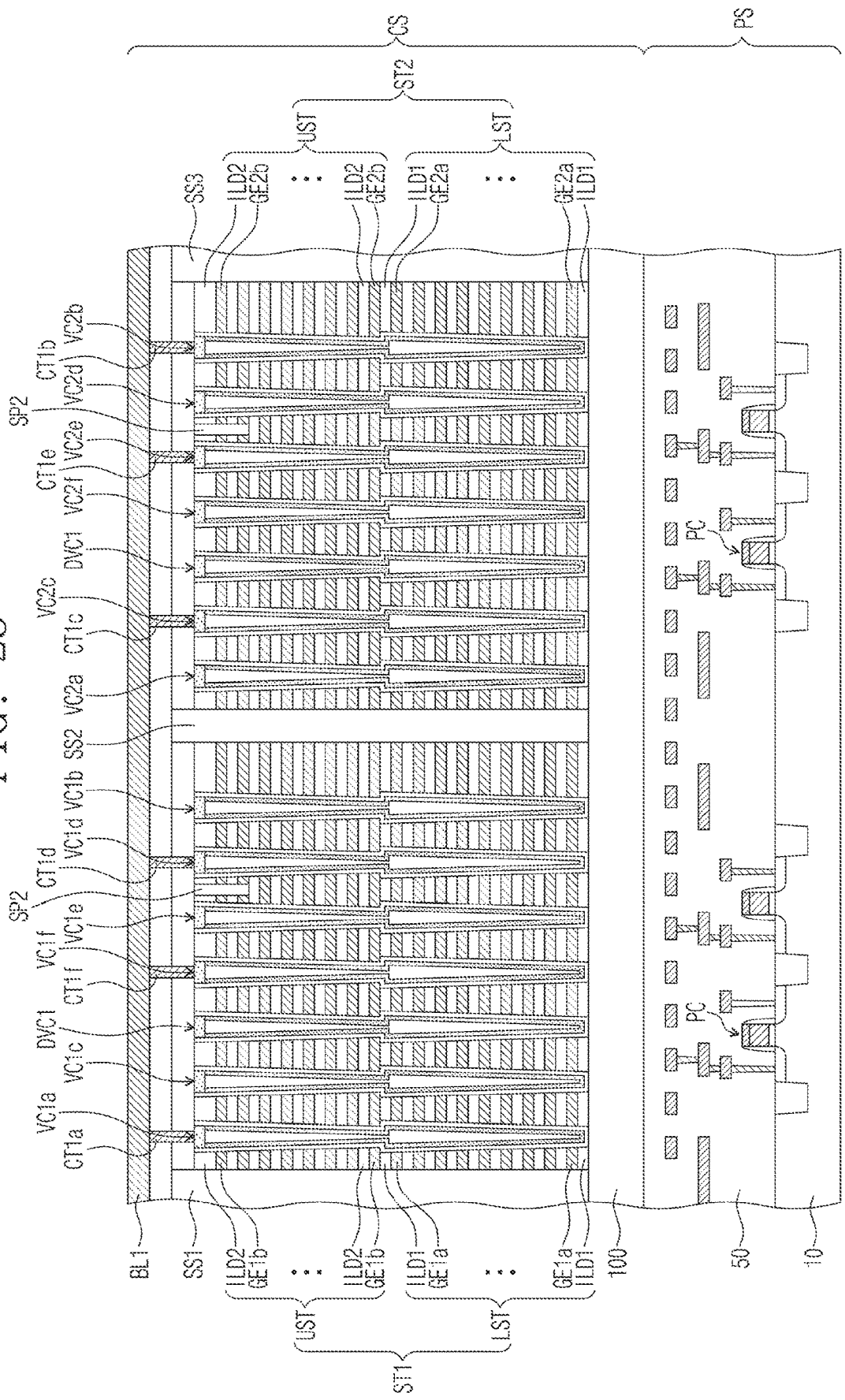
FIG. 23 is a sectional view illustrating a semiconductor device according to an embodiment of the disclosure.

FIG. 23 is a sectional view illustrating a semiconductor device according to an embodiment of the disclosure. The same technical features as the semiconductor memory device described above will not be described in much further detail, for concise description.

According to the embodiment shown in FIG. 23, a semiconductor device may include a peripheral circuit structure PS and a cell array structure CS on the peripheral circuit structure PS.

The peripheral circuit structure PS may include peripheral circuits PC, which are integrated on a top surface of a semiconductor substrate 10, and a lower insulating layer 50, which is provided to cover the peripheral circuits PC.

The peripheral circuits PC may be row and column decoders, page buffers, and a control circuit. In detail, the peripheral circuits PC may include NMOS and PMOS transistors. Peripheral circuit interconnection lines may be electrically connected to the peripheral circuits PC through peripheral contact plugs.

The lower insulating layer 50 may be provided on the top surface of the semiconductor substrate 10. The lower insulating layer 50 may be provided on the semiconductor substrate 10 to cover not only the peripheral circuits PC but also peripheral contact plugs and peripheral circuit interconnection lines, which are electrically connected to the peripheral circuits PC.

The lower insulating layer 50 may include a plurality of vertically-stacked insulating layers. For example, the lower insulating layer 50 may include a silicon oxide layer, a silicon nitride layer, a silicon oxynitride layer, and/or a low-k dielectric layer.

The cell array structure CS may be disposed on the lower insulating layer 50. The cell array structure CS may include the first and second cell structures provided on the substrate 100, as described above. Each of the first and second cell structures may include the stacks ST1 and ST2, the separation structures SS1, SS2, and SS3, the vertical channels VC1*a*-VC1*f*, VC2*a*-VC2*f*, DVC1, and DVC2, and the bit lines BL1-BL4, as described above.

The substrate 100 may be disposed on a top surface of the lower insulating layer 50. The substrate 100 may be formed of or include at least one of semiconductor, insulating, or conductive materials. The substrate 100 may be formed of or include a semiconductor material, which is doped to have the first conductivity type (e.g., n-type) and/or an undoped or intrinsic semiconductor material. The substrate 100 may have one of poly-crystalline, amorphous, and single-crystalline structures.

Each of the first and second stacks ST1 and ST2 may include a lower stack LST and an upper stack UST on the lower stack LST. The lower stack LST may include lower electrodes GE1*a* and GE2*a*, which are vertically stacked on the substrate 100, and lower insulating layers ILD1, which are respectively interposed between the lower electrodes GE1*a* and GE2*a*.

The upper stack UST may include upper electrodes GE1*b* and GE2*b*, which are vertically stacked on the uppermost one of the lower electrodes GE1*a*, and upper insulating layers ILD2, which are respectively interposed between the upper electrodes GE1*b* and GE2*b*. The lowermost one of the upper electrodes GE2*b* may be disposed on the uppermost one of the lower insulating layers ILD1.

Each of the vertical channels VC1*a*-VC1*f*, VC2*a*-VC2*f*, DVC1, and DVC2 may include a lower channel penetrating the lower stack LST, an upper channel penetrating the upper stack UST, and an expanded portion between the lower and upper channels. The expanded portion may be provided in the uppermost one of the lower insulating layers ILD1. A diameter of each of the vertical channels VC1*a*-VC1*f*, VC2*a*-VC2*f*, DVC1, and DVC2 may be abruptly increased near the expanded portion.

Figure 24:
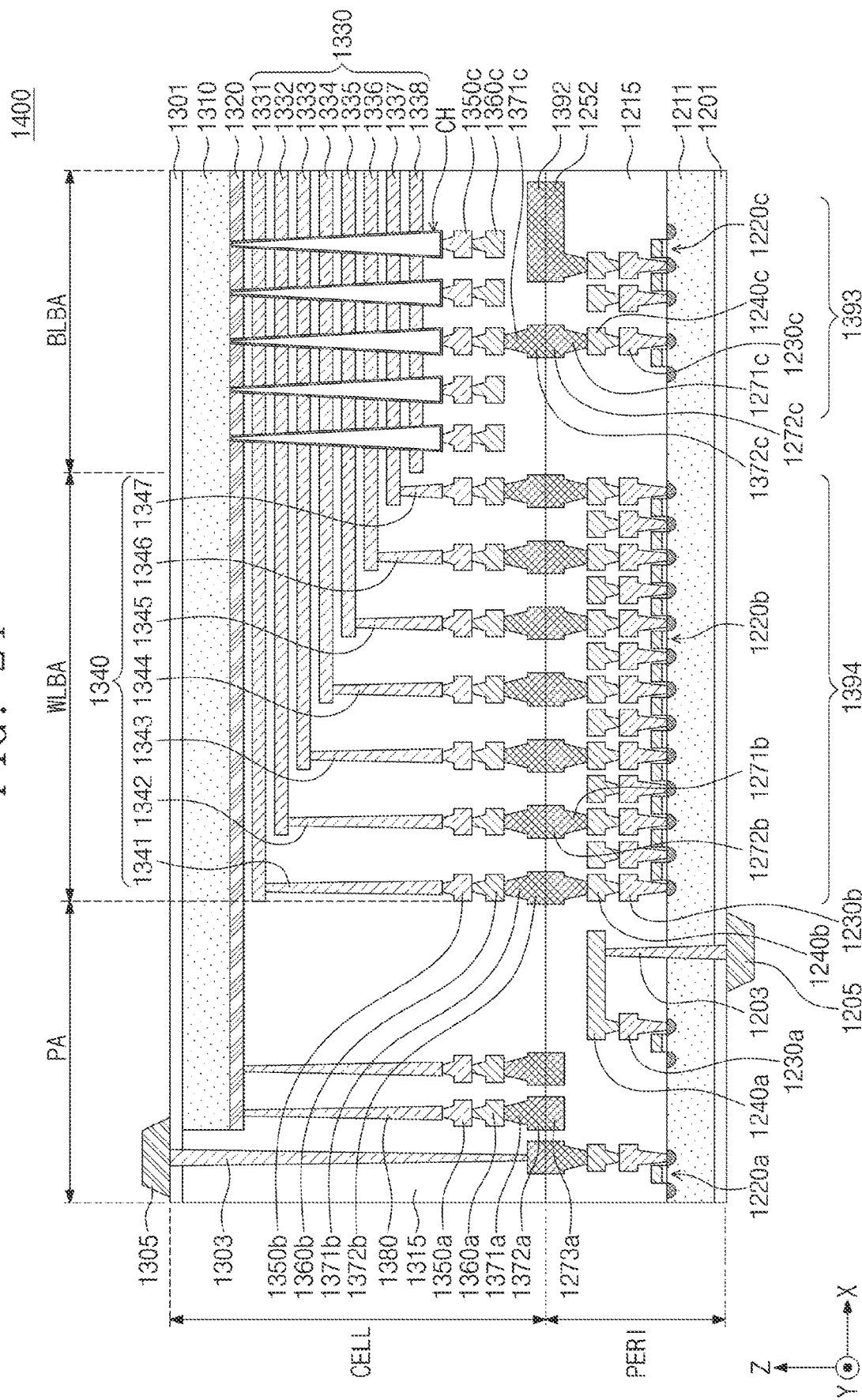
FIG. 24 is a sectional view illustrating a semiconductor device according to an embodiment of the disclosure.

FIG. 24 is a sectional view illustrating a semiconductor device according to an embodiment of the disclosure.

Referring to FIG. 24, a memory device 1400 may be provided to have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other through a bonding method. The bonding method may mean a way of electrically connecting a bonding metal formed in the uppermost metal layer of the upper chip to a bonding metal formed in the uppermost metal layer of the lower chip. For example, in the case where the bonding metal is formed of copper (Cu), the bonding method may be a Cu-to-Cu bonding method, but in an embodiment, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1211, an interlayer insulating layer 1215, a plurality of circuit devices 1220*a*, 1220*b*, and 1220*c* formed on the first substrate 1211, first metal layers 1230*a*, 1230*b*, and 1230*c* connected to the circuit devices 1220*a*, 1220*b*, and 1220*c*, respectively, and second metal layers 1240*a*, 1240*b*, and 1240*c* formed on the first metal layers 1230*a*, 1230*b*, and 1230*c*. In an embodiment, the first metal layers 1230*a*, 1230*b*, and 1230*c* may be formed of a material (e.g., tungsten) having relatively high electric resistivity and the second metal layers 1240*a*, 1240*b*, and 1240*c* may be formed of a material (e.g., copper) having relatively low electric resistivity.

Although only the first metal layers 1230*a*, 1230*b*, and 1230*c* and the second metal layers 1240*a*, 1240*b*, and 1240*c* are illustrated and described in the present specification, the disclosure is not limited thereto and at least one metal layer may be additionally formed on the second metal layers 1240a, 1240b, and 1240c. At least one of the additional metal layers, which are formed on the second metal layers 1240a, 1240b, and 1240c, may be formed of a material (e.g., aluminum), which has lower electric resistivity than the material (e.g., copper) of the second metal layers 1240a, 1240b, and 1240c.

The interlayer insulating layer 1215 may be disposed on the first substrate 1211 to cover the circuit devices 1220a, 1220b, and 1220c, the first metal layers 1230a, 1230b, and 1230c, and the second metal layers 1240a, 1240b, and 1240c and may be formed of or include at least one of insulating materials (e.g., silicon oxide or silicon nitride).

Lower bonding metals 1271b and 1272b may be formed on the second metal layer 1240b of the word line bonding region WLBA. In the word line bonding region WLBA, the lower bonding metals 1271b and 1272b of the peripheral circuit structure PERI may be electrically connected to upper bonding metals 1371b and 1372b of the cell array structure CELL by the bonding method, and the lower bonding metals 1271b and 1272b and the upper bonding metals 1371b and 1372b may be formed of or include at least one of aluminum, copper, or tungsten.

The cell array structure CELL may include at least one memory block. The cell array structure CELL may include the first and second stacks in the embodiments described above. The cell array structure CELL may include a second substrate 1310 and a common source line 1320. A plurality of word lines 1331-1338 (1330) may be stacked on the second substrate 1310 in a direction (e.g., a z-axis direction) that is perpendicular to a top surface of the second substrate 1310. String selection lines and a ground selection line may be respectively disposed on and below the word lines 1330, and the word lines 1330 may be disposed between the string selection lines and the ground selection line.

In the bit line bonding region BLBA, a channel structure CH may be provided to extend in the direction (e.g., the z-axis direction) perpendicular to a top surface of the second substrate 1310 and to penetrate the word lines 1330, the string selection lines, and the ground selection line. The channel structure CH may include a data storage layer, a channel layer, and a gapfill insulating layer, and in this case, a first metal layer 1350c and a second metal layer 1360c may be electrically connected to the channel layer. For example, the first metal layer 1350c may be a bit line contact and the second metal layer 1360c may be a bit line. In an embodiment, the bit line 1360c may be extended in a first direction (e.g., a y-axis direction) parallel to the top surface of the second substrate 1310.

In the embodiment of FIG. 24, a region in which the channel structure CH and the bit lines 1360c are provided may be defined as the bit line bonding region BLBA. In the bit line bonding region BLBA, the bit lines 1360c may be electrically connected to the circuit devices 1220c, which constitute a page buffer 1393 of the peripheral circuit structure PERI. As an example, the bit lines 1360c may be connected to upper bonding metals 1371c and 1372c of the peripheral circuit structure PERI and the upper bonding metals 1371c and 1372c may be connected to lower bonding metals 1271c and 1272c, which are connected to the circuit devices 1220c of the page buffer 1393.

In the word line bonding region WLBA, the word lines 1330 may be extended in a second direction (e.g., an x-axis direction), which is perpendicular to the first direction and is parallel to the top surface of the second substrate 1310, and may be connected to a plurality of cell contact plugs 1341-1347 (1340). The cell contact plugs 1340 may be connected to pads of the word lines 1330, which are extended to have different lengths in the second direction. A first metal layer 1350b and a second metal layer 1360b may be sequentially connected to upper portions of the cell contact plugs 1340 connected to the word lines 1330. In the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

In the peripheral circuit structure PERI, the cell contact plugs 1340 may be electrically connected to the circuit devices 1220b constituting a row decoder 1394. In an embodiment, an operation voltage of the circuit devices 1220b constituting the row decoder 1394 may be different from an operation voltage of the circuit devices 1220c constituting the page buffer 1393. As an example, the operation voltage of the circuit devices 1220c constituting the page buffer 1393 may be higher than the operation voltage of the circuit devices 1220b constituting the row decoder 1394.

A common source line contact plug 1380 may be disposed in the outer pad bonding region PA. The common source line contact plug 1380 may be formed of a conductive material (e.g., metals, metal compounds, or polysilicon) and may be electrically connected to the common source line 1320. A first metal layer 1350a and a second metal layer 1360a may be sequentially stacked on the common source line contact plug 1380. The outer pad bonding region PA may be or include a region in which the common source line contact plug 1380, the first metal layer 1350a, and the second metal layer 1360a are provided.

Meanwhile, input/output pads 1205 and 1305 may be disposed in the outer pad bonding region PA. Referring to FIG. 24, a lower insulating layer 1201 may be formed below the first substrate 1211 to cover a bottom surface of the first substrate 1211 and the first input/output pad 1205 may be formed on the lower insulating layer 1201. The first input/output pad 1205 may be connected to at least one of the circuit devices 1220a, 1220b, and 1220c of the peripheral circuit structure PERI through a first input/output contact plug 1203 and may be separated from the first substrate 1211 by the lower insulating layer 1201. In addition, a sidewall insulating layer (not shown) may be disposed between the first input/output contact plug 1203 and the first substrate 1211 to electrically separate the first input/output contact plug 1203 from the first substrate 1211.

Referring to FIG. 24, an upper insulating layer 1301 may be formed on the second substrate 1310 to cover the top surface of the second substrate 1310 and the second input/output pad 1305 may be disposed on the upper insulating layer 1301. The second input/output pad 1305 may be connected to at least one of the circuit devices 1220a, 1220b, and 1220c of the peripheral circuit structure PERI through a second input/output contact plug 1303. For example, the second input/output pad 1305 may be electrically connected to the circuit device 1220a.

In an embodiment, the second substrate 1310 and the common source line 1320 may not be disposed in a region provided with the second input/output contact plug 1303. In addition, the second input/output pad 1305 may not be overlapped with the word lines 1330 in the third direction (e.g., the z-axis direction). Referring to FIG. 24, the second input/output contact plug 1303 may be separated from the second substrate 1310 in a direction parallel to the top surface of the second substrate 1310, may penetrate an interlayer insulating layer 1315 of the cell array structure CELL, and may be connected to the second input/output pad 1305.

In an embodiment, the first input/output pad 1205 and the second input/output pad 1305 may be selectively formed. As an example, the memory device 1400 may be configured to include only one of the first and second input/output pads 1205 and 1305, which are respectively provided on the first and second substrates 1211 and 1310. Alternatively, the memory device 1400 may be configured to include both of the first and second input/output pads 1205 and 1305.

A metal pattern, which is used as a dummy pattern, may be provided in the uppermost metal layer of the outer pad bonding region PA and the bit line bonding region BLBA, which are included in each of the cell array structure CELL and the peripheral circuit structure PERI, but in an embodiment, such a metal pattern may not be provided.

The memory device 1400 may include an upper metal pattern 1372*a* and a lower metal pattern 1273*a*, which are provided in the outer pad bonding region PA, and here, the lower metal pattern 1273*a* may be formed in the uppermost metal layer of the peripheral circuit structure PERI to correspond to the upper metal pattern 1372*a*, which is formed in the uppermost metal layer of the cell array structure CELL, and may have the same shape as the upper metal pattern 1372*a* of the cell array structure CELL. The lower metal pattern 1273*a*, which is formed in the uppermost metal layer of the peripheral circuit structure PERI, may not be connected to any contact plug, in the peripheral circuit structure PERI. Similarly, in the outer pad bonding region PA, the upper metal pattern 1372*a* may be formed in the uppermost metal layer of the cell array structure CELL to correspond to the lower metal pattern 1273*a*, which is formed in the uppermost metal layer of the peripheral circuit structure PERI, and in this case, the upper metal pattern 1372*a* may have the same shape as the lower metal pattern 1273*a* of the peripheral circuit structure PERI.

The lower bonding metals 1271*b* and 1272*b* may be formed on the second metal layer 1240*b* of the word line bonding region WLBA. In the word line bonding region WLBA, the lower bonding metals 1271*b* and 1272*b* of the peripheral circuit structure PERI may be electrically connected to the upper bonding metals 1371*b* and 1372*b* of the cell array structure CELL through a bonding method.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI, and in this case, the upper metal pattern 1392 may have the same shape as the lower metal pattern 1252 of the peripheral circuit structure PERI. In an embodiment, any contact plug may not be formed on the upper metal pattern 1392, which is formed in the uppermost metal layer of the cell array structure CELL.

According to an embodiment of the disclosure, vertical channels may be classified into a plurality of types, depending on a distance from each of separation structures, and each bit line may be electrically connected to all types of the vertical channels. Thus, all bit lines may have substantially the same coupling capacitance.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments of the disclosure have been particularly shown and described, it will be understood by one of ordinary skill in the art that variations in form and detail may be made therein without departing from the spirit and scope of the attached claims.

What is claimed is:

1. A semiconductor device, comprising:
   stacks provided on a substrate and extended in a first direction;
   separation structures extended in the first direction and respectively provided between the stacks;
   a plurality of vertical channels penetrating each of the stacks;
   bit lines extended in a second direction crossing the first direction, each of the vertical channels being overlapped with a pair of the bit lines; and
   contact plugs connecting the bit lines to the vertical channels,
   wherein each of the stacks comprises:
      a plurality of electrodes stacked on the substrate; and
      at least two upper separation patterns dividing an upper one of the plurality of electrodes into a plurality of portions in the second direction,
   wherein the vertical channels include a plurality of types of vertical channels, the plurality of types of vertical channels include a first type of vertical channel and a second type of vertical channel, each vertical channel of the first type of vertical channel has a first distance from respective one of the separation structures in the second direction, each vertical channel of the second type of vertical channel has a second distance from the respective one of the separation structures in the second direction, and the second distance is larger than the first distance, and
   each of the bit lines is connected to all types of the vertical channels.

2. The semiconductor device of claim 1, wherein a number of the vertical channels connected to each of the bit lines is a same.

3. The semiconductor device of claim 1, further comprising dummy vertical channels penetrating the upper separation patterns and the stacks,
   wherein the dummy vertical channels are electrically separated from the bit lines.

4. The semiconductor device of claim 3, wherein each of the dummy vertical channels is spaced apart from the vertical channels adjacent thereto in a direction, which is oblique to the first and second directions.

5. The semiconductor device of claim 1, wherein the stacks comprise first stacks and second stacks, which are spaced apart from each other with one of the separation structures interposed therebetween,
the vertical channels comprise first vertical channels penetrating the first stacks and second vertical channels penetrating the second stacks, and
the types of the first vertical channels connected to a first one of the bit lines are different from the types of the second vertical channels connected to the first one of the bit lines.

6. The semiconductor device of claim 1, wherein the stacks comprise first stacks and second stacks, which are spaced apart from each other with one of the separation structures interposed therebetween,
the vertical channels comprise first vertical channels penetrating the first stacks and second vertical channels penetrating the second stacks, and
the first vertical channels are arranged in substantially a same manner as the second vertical channels.

7. The semiconductor device of claim 1, wherein the stacks comprise first stacks and second stacks, which are spaced apart from each other with a first one of the separation structures interposed therebetween,
the vertical channels comprise first vertical channels penetrating the first stacks and second vertical channels penetrating the second stacks, and
the first vertical channels and the second vertical channels are provided to have a mirror symmetry with respect to the first one of the separation structures.

8. The semiconductor device of claim 1, wherein the bit lines comprise first to fourth bit lines, which are sequentially arranged in the first direction,
the vertical channels are arranged to form a zigzag shape in the second direction,
the stacks comprise first stacks and second stacks, and the vertical channels comprise first vertical channels penetrating the first stacks and second vertical channels penetrating the second stacks, and
the first and second bit lines are disposed on a first row of the first and second vertical channels, which are arranged in the second direction, and
the third and fourth bit lines are disposed on a second row of the first and second vertical channels, which are arranged in the second direction.

9. The semiconductor device of claim 1, wherein the stacks comprise first and second stacks, which are spaced apart from each other with one of the separation structures interposed therebetween,
the vertical channels comprise first vertical channels penetrating the first stack and second vertical channels penetrating the second stack,
the first and second vertical channels comprise first to sixth types, which are sequentially arranged from each of the separation structures, and
each of the bit lines is connected to some of the first to sixth types of the first vertical channels and remaining ones of the first to sixth types of the second vertical channels.

10. The semiconductor device of claim 1, wherein, in each of the stacks, the electrodes comprise first, second, and third upper electrodes, which are separated from each other in the second direction by the upper separation patterns,
the vertical channels comprise first to sixth types, which are sequentially arranged from each of the separation structures,
the first to fourth types of the vertical channels are provided to penetrate the first or third upper electrode, and
the fifth and sixth types of the vertical channels are provided to penetrate the second upper electrode.

11. The semiconductor device of claim 10, wherein the vertical channels are arranged to form a zigzag shape in the second direction.

12. The semiconductor device of claim 10, further comprising:
first dummy vertical channels disposed between the first and second upper electrodes; and
second dummy vertical channels disposed between the second and second upper electrodes,
wherein the first and second dummy vertical channels are electrically separated from the bit lines.

13. A semiconductor device, comprising:
a first stack including a plurality of first electrodes, which are stacked on a substrate, and at least two first upper separation patterns, which horizontally divides a first upper electrode of the first electrodes into a plurality of portions;
a second stack including a plurality of second electrodes, which are stacked on the substrate, and at least two second upper separation patterns, which horizontally divides a second upper electrode of the second electrodes into a plurality of portions;
a plurality of first vertical channels penetrating the first stack;
a plurality of second vertical channels penetrating the second stack;
a plurality of bit lines crossing the first and second stacks; and
contact plugs connecting the first and second vertical channels to the bit lines,
wherein each of the first and second vertical channels is overlapped with a pair of the bit lines,
the first and second vertical channels include a plurality of types of vertical channels, the plurality of types of vertical channels include a first type of vertical channel and a second type of vertical channel, each vertical channel of the first type of vertical channel has a first distance from respective one of separation structures in a second direction, each vertical channel of the second type of vertical channel has a second distance from the respective one of the separation structures in the second direction, and the second distance is larger than the first distance, and
each of the bit lines is connected to some types of the first vertical channels and remaining types of the second vertical channels.

14. The semiconductor device of claim 13, further comprising the separation structures, which are provided on the substrate, are extended in a first direction, and are spaced apart from each other in the second direction,
wherein each of the first and second vertical channels is disposed between a pair of separation structures, and
the first vertical channels and the second vertical channels are provided to have a mirror symmetry about one of the separation structures between the first and second vertical channels.

15. The semiconductor device of claim 13, wherein the bit lines comprise first to fourth bit lines, which are sequentially arranged in a first direction, the first vertical channels are arranged to form a zigzag shape in the second direction, the first and second bit lines are disposed on a first row of the first and second vertical channels, which are arranged in the second direction, the third and fourth bit lines are disposed on a second row of the first and second vertical channels, which are arranged in the second direction.

16. The semiconductor device of claim 15, wherein each of the first and second vertical channels is connected one of the pair of bit lines through a corresponding one of the contact plugs.

17. The semiconductor device of claim 15, wherein the contact plugs comprise:

first contact plugs connecting the first bit line to the first and second vertical channels;

second contact plugs connecting the second bit line to the first and second vertical channels;

third contact plugs connecting the third bit line to the first and second vertical channels; and fourth contact plugs connecting the fourth bit line to the first and second vertical channels.

18. The semiconductor device of claim 13, wherein each of the first and second upper electrodes of the first and second stacks comprises first, second, and third sub-upper electrodes, which are spaced apart from each other in the second direction, the first vertical channels and the second vertical channels comprise first to sixth types, which are sequentially arranged from each of the separation structures, the first to fourth types of the first vertical channels and the first to fourth types of the second vertical channels are provided to penetrate a corresponding first or third sub-upper electrode, and the fifth and sixth types of the first vertical channels and the fifth and sixth types of the second vertical channels are provided to penetrate a corresponding second sub-upper electrode.

19. An electronic system, comprising:

a semiconductor device including a cell structure, a peripheral circuit connected to the cell structure, and an input/output pad electrically connected to the peripheral circuit; and a controller electrically connected to the semiconductor device through the input/output pad to control the semiconductor device, wherein the cell structure comprises:

stacks provided on a substrate and extended in a first direction;

separation structures extended in the first direction and respectively provided between the stacks;

a plurality of vertical channels penetrating each of the stacks;

bit lines extended in a second direction crossing the first direction, each of the vertical channels being overlapped with two bit lines of the bit lines; and contact plugs connecting the bit lines to the vertical channels, wherein each of the stacks comprises:

a plurality of electrodes stacked on the substrate;

a first upper electrode, a second upper electrode, and a third upper electrode horizontally spaced apart from each other on an uppermost electrode of the plurality of electrodes;

a first upper separation pattern between the first upper electrode and the second upper electrode on the uppermost electrode of the plurality of electrodes; and a second upper separation pattern between the second upper electrode and the third upper electrode on the uppermost electrode of the plurality of electrodes, wherein the plurality of vertical channels include first to sixth types respectively located at first to sixth distances in the second direction from each of the separation structures, and each of the bit lines is connected to one of the first types, one of the second types, one of the third types, one of the fourth types, one of the fifth types, and one of the sixth types of the plurality of vertical channels.

20. The electronic system of claim 19, wherein the stacks comprise first and second stacks, which are spaced apart from each other with one of the separation structures interposed therebetween, the vertical channels comprise first vertical channels penetrating the first stack and second vertical channels penetrating the second stack, and each of the bit lines is connected to some types of the first vertical channels of and remaining types of the second vertical channels.

* * * * *